United States Patent
Feng et al.

(10) Patent No.: US 12,439,791 B2
(45) Date of Patent: Oct. 7, 2025

(54) ARRAY SUBSTRATE AND DISPLAY DEVICE

(71) Applicants: HEFEI BOE JOINT TECHNOLOGY CO., LTD., Hefei (CN); BOE TECHNOLOGY GROUP CO., LTD., Beijing (CN)

(72) Inventors: Xuehuan Feng, Beijing (CN); Yongqian Li, Beijing (CN)

(73) Assignees: HEFEI BOE JOINT TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/021,646

(22) PCT Filed: May 25, 2022

(86) PCT No.: PCT/CN2022/094881
§ 371 (c)(1),
(2) Date: Feb. 16, 2023

(87) PCT Pub. No.: WO2023/225893
PCT Pub. Date: Nov. 30, 2023

(65) Prior Publication Data
US 2024/0268171 A1    Aug. 8, 2024

(51) Int. Cl.
| | |
|---|---|
| H10K 59/131 | (2023.01) |
| G02F 1/1362 | (2006.01) |
| G09G 3/32 | (2016.01) |
| H01L 23/60 | (2006.01) |

(Continued)

(52) U.S. Cl.
CPC ..... *H10K 59/1315* (2023.02); *H10K 59/1213* (2023.02); *H10K 59/351* (2023.02)

(58) Field of Classification Search
CPC ........... H10K 59/1315; H10K 59/1213; H10K 59/351; G02F 1/1362; G09G 3/32; H01L 23/60
See application file for complete search history.

(56) References Cited

U.S. PATENT DOCUMENTS

| | | | |
|---|---|---|---|
| 9,638,949 B1 * | 5/2017 | Kim | G06F 3/04164 |
| 10,311,765 B2 * | 6/2019 | Hao | G09G 3/36 |
| 10,943,543 B2 * | 3/2021 | Cheng | G09G 3/3688 |

(Continued)

*Primary Examiner* — Mohsen Ahmadi
(74) *Attorney, Agent, or Firm* — Dilworth & Barrese, LLP.; Michael J. Musella, Esq.

(57) ABSTRACT

An array substrate and a display device are provided. The array substrate includes a base substrate, and gate lines, a gate driving structure, an interconnecting structure and an insulating layer. The gate lines are electrically connected with the gate driving structure through the interconnecting structure; the insulating layer is located between the gate lines and the interconnecting structure, and includes a first via hole and a second via hole. The gate line includes a first connecting portion and a second connecting portion, and the second connecting portion is located between the gate driving structure and the first connecting portion; the first connecting portion is electrically connected with the interconnecting structure through the first via hole, and a straight line extending in a direction perpendicular to the base substrate passes through the second connecting portion, the second via hole and the interconnecting structure in turn.

17 Claims, 10 Drawing Sheets

(51) Int. Cl.
*H10K 59/121* (2023.01)
*H10K 59/35* (2023.01)

(56) References Cited

U.S. PATENT DOCUMENTS

| | | | |
|---|---|---|---|
| 11,670,645 B2* | 6/2023 | Yao | H10D 86/443 |
| | | | 257/79 |
| 2013/0102115 A1* | 4/2013 | Yaneda | H10D 86/0231 |
| | | | 438/155 |
| 2015/0145055 A1* | 5/2015 | Kim | H01L 23/5226 |
| | | | 438/618 |
| 2015/0331270 A1* | 11/2015 | Yokogawa | G02F 1/133345 |
| | | | 349/33 |
| 2016/0293270 A1* | 10/2016 | Jin | G11C 19/287 |
| 2018/0218657 A1* | 8/2018 | Hao | G02F 1/1335 |
| 2020/0064700 A1* | 2/2020 | Cheng | H10D 86/441 |
| 2020/0357343 A1* | 11/2020 | Cheng | G02F 1/136204 |
| 2021/0134850 A1* | 5/2021 | Yao | H10D 86/60 |
| 2021/0157207 A1* | 5/2021 | Zhang | H10D 86/60 |

* cited by examiner

ARRAY SUBSTRATE AND DISPLAY DEVICE

TECHNICAL FIELD

Embodiments of the present disclosure relate to an array substrate and a display device.

BACKGROUND

At present, large-sized organic light emitting diode display devices are becoming more and more popular due to characteristics, such as high contrast and self-luminescence, etc. For example, large-sized organic light emitting diode display devices can include 55-inch products and 95-inch products, etc.

SUMMARY

Embodiments of the present disclosure provides an array substrate and a display device.

An embodiment of the present disclosure provides an array substrate including: a base substrate, which includes a first region and a second region, the second region being located on at least one side of the first region in a first direction; a plurality of gate lines, located in the first region of the base substrate, the plurality of gate lines being arranged along a second direction, the first direction being intersected with the second direction; a gate driving structure, located in the second region of the base substrate, and the gate driving structure being configured to be electrically connected with the plurality of gate lines; an interconnecting structure, located at a side of the plurality of gate lines away from the base substrate, the plurality of gate lines being electrically connected with the gate driving structure through the interconnecting structure; an insulating layer, located between the plurality of gate lines and the interconnecting structure. A part, close to the gate driving structure, of at least one gate line of the plurality of gate lines includes a first connecting portion and a second connecting portion, and the second connecting portion is located between the gate driving structure and the first connecting portion, the insulating layer includes at least one first via hole and at least one second via hole, the first connecting portion is electrically connected with the interconnecting structure through the first via hole so as to be electrically connected with the gate driving structure, and a straight line extending in a direction perpendicular to the base substrate passes through the second connecting portion, the second via hole and the interconnecting structure in turn.

For example, according to an embodiment of the present disclosure, at least a part of the second connecting portion is electrically connected with the interconnecting structure through the second via hole so as to be electrically connected with the gate driving structure; the interconnecting structure includes a plurality of sub-interconnecting structures, and two sub-interconnecting structures, which are respectively electrically connected with the first connecting portion and the second connecting portion of a same gate line, are electrically connected with each other.

For example, according to an embodiment of the present disclosure, each gate line includes a gate line main body portion extending in a direction intersected with the second direction, and in the at least one gate line, both the first connecting portion and the second connecting portion protrude toward a same side of the gate line main body portion in the second direction.

For example, according to an embodiment of the present disclosure, the interconnecting structure further includes a connecting line, and the two sub-interconnecting structures, which are respectively electrically connected with the first connecting portion and the second connecting portion of the same gate line, are electrically connected with each other through the connecting line, and the two sub-interconnecting structures, the gate line main body portion and the connecting line enclose a hollow region.

For example, according to an embodiment of the present disclosure, the second connecting portion includes a tip part.

For example, according to an embodiment of the present disclosure, the second connecting portion is located at one end of the gate line close to the gate driving structure.

For example, according to an embodiment of the present disclosure, the second connecting portion further includes a main part connected with the tip part, the main part is closer to the gate line main body portion than the tip part is, and a ratio of an area of an orthographic projection of the main part on the base substrate to an area of an orthographic projection of the first connecting portion on the base substrate is in a range of 0.9-1.1.

For example, according to an embodiment of the present disclosure, in terms of the main part and the tip part connected with each other, an area of an orthographic projection of the tip part on the base substrate is smaller than an area of the orthographic projection of the main part on the base substrate.

For example, according to an embodiment of the present disclosure, the gate driving structure further includes a first power line, and the first power line is a component closest to the plurality of gate lines among components, arranged in the same layer as the plurality of gate lines, in the gate driving structure; the interconnecting structure further includes a connecting line electrically connected with the sub-interconnecting structure, an extending direction of the first power line is intersected with an extending direction of at least part of the connecting line, the gate driving structure includes output ends electrically connected with the plurality of gate lines, the output ends are located at a side of the first power line away from the plurality of gate lines, and the connecting line is electrically connected with the output end across the first power line.

For example, according to an embodiment of the present disclosure, a distance between the gate line main body portion and a connecting line corresponding to the gate line main body portion in the second direction is less than a size of the first connecting portion in the second direction.

For example, according to an embodiment of the present disclosure, the at least one gate line is provided with at least one protrusion, and the at least one protrusion is located between the first connecting portion and the second connecting portion.

For example, according to an embodiment of the present disclosure, the at least one protrusion includes a plurality of protrusions, and in terms of the plurality of protrusions, an area of an orthographic projection of a protrusion closest to the second connecting portion on the base substrate is greater than an area of an orthographic projection of a protrusion farthest from the second connecting portion on the base substrate.

For example, according to an embodiment of the present disclosure, the at least one first via hole includes a plurality of first via holes, the at least one second via hole includes a plurality of second via holes, and a ratio of a count of the first via holes to a count of the second via holes is in a range of 0.9-1.1.

For example, according to an embodiment of the present disclosure, the array substrate further includes: a plurality of sub-pixels, located in the first region of the base substrate and at a side of the first connecting portion away from the gate driving structure. The plurality of gate lines include a plurality of first gate lines and a plurality of second gate lines, the plurality of first gate lines and the plurality of second gate lines are alternately arranged along the second direction, and at least part sub-pixels include a light emitting element and a driving circuit for driving the light emitting element to emit light, the driving circuit includes at least two transistors, and gate electrodes of two transistors of the at least two transistors are electrically connected with the first gate line and the second gate line, respectively.

For example, according to an embodiment of the present disclosure, in terms of the first gate line and the second gate line electrically connected with a same driving circuit, the first connecting portion of the first gate line and the second connecting portion of the first gate line are both located at one side of the first gate line close to the second gate line, and the first connecting portion of the second gate line and the second connecting portion of the second gate line are both located at one side of the second gate line close to the first gate line.

For example, according to an embodiment of the present disclosure, the array substrate further includes: a plurality of data lines, located in the first region of the base substrate and arranged along the first direction; a plurality of second power lines, located in the first region of the base substrate and arranged along the first direction, and at least part of the plurality of second power lines are arranged in the same layer as the plurality of data lines. The plurality of data lines and at least certain components of the interconnecting structure are arranged in a same layer, and the driving circuit of each sub-pixel is electrically connected with one data line.

For example, according to an embodiment of the present disclosure, the driving circuit of each of at least certain sub-pixels includes an active layer, the plurality of sub-pixels include a plurality of first color sub-pixels and a plurality of second color sub-pixels, and an area of the active layer of one first color sub-pixel is greater than an area of the active layer of one second color sub-pixel.

For example, according to an embodiment of the present disclosure, the plurality of sub-pixels are arrayed along the first direction and the second direction to form a plurality of pixel rows and a plurality of pixel columns, one of the first direction and the second direction is a row direction, and the other of the first direction and the second direction is a column direction, the plurality of sub-pixels further include a plurality of third color sub-pixels and a plurality of fourth color sub-pixels, and at least one pixel row includes the first color sub-pixel, the second color sub-pixel, the third color sub-pixel and the fourth color sub-pixel which are sequentially and circularly arranged along the row direction.

For example, according to an embodiment of the present disclosure, the first gate line and the second gate line which are electrically connected with a same driving circuit are respectively located at two sides of a pixel row where the driving circuit is located.

For example, according to an embodiment of the present disclosure, the at least one gate line is provided with at least one opening.

For example, according to an embodiment of the present disclosure, each of at least certain gate lines of the plurality of gate lines includes a plurality of sub-gate lines arranged at intervals along an extending direction thereof, and two adjacent sub-gate lines are electrically connected through a connecting unit, and the connecting unit and the gate line are located in different layers.

For example, according to an embodiment of the present disclosure, the connecting unit is located between two adjacent sub-gate lines, the connecting unit includes a first connecting unit and a second connecting unit which are stacked and are arranged between the two adjacent sub-gate lines, the first connecting unit is located between the gate line and the base substrate, the second connecting unit is located at a side of the gate line away from the base substrate, the first connecting unit is electrically connected with the second connecting unit, and the gate line is electrically connected with the second connecting unit.

For example, according to an embodiment of the present disclosure, the array substrate further includes a plurality of data lines, arranged along the first direction. The plurality of data lines and at least certain components of the interconnecting structure are arranged in a same layer, and at least part of the plurality of data lines and the second connecting unit are arranged in a same layer.

An embodiment of the present disclosure provides another array substrate, including a base substrate, which includes a first region and a second region, the second region being located on at least one side of the first region in a first direction; a plurality of gate lines located in the first region of the base substrate, the plurality of gate lines being arranged along a second direction, the first direction being intersected with the second direction; a gate driving structure, located in the second region of the base substrate, and the gate driving structure being configured to be electrically connected with the plurality of gate lines; an interconnecting structure, located at a side of the plurality of gate lines away from the base substrate, the plurality of gate lines being electrically connected with the gate driving structure through the interconnecting structure; an insulating layer, located between the plurality of gate lines and the interconnecting structure. A part, close to the gate driving structure, of at least one gate line of the plurality of gate lines includes a connecting portion and an electrostatic discharge pad, the electrostatic discharge pad is located between the gate driving structure and the connecting portion, and the electrostatic discharge pad includes a tip part; the insulating layer includes at least one first via hole, and the connecting portion is electrically connected with the interconnecting structure through the first via hole so as to be electrically connected with the gate driving structure.

For example, according to an embodiment of the present disclosure, the insulating layer further includes at least one second via hole, and a straight line extending in a direction perpendicular to the base substrate passes through the electrostatic discharge pad, the second via hole and the interconnecting structure in turn.

For example, according to an embodiment of the present disclosure, the electrostatic discharge pad is located at one end of the gate line close to the gate driving structure.

For example, according to an embodiment of the present disclosure, the electrostatic discharge pad further includes a main part connected with the tip part, and a ratio of an area of an orthographic projection of the main part on the base substrate to an area of an orthographic projection of the connecting portion on the base substrate is in a range of 0.9-1.1.

For example, according to an embodiment of the present disclosure, the at least one gate line is provided with at least one protrusion, and the at least one protrusion is located between the connecting portion and the electrostatic discharge pad.

For example, according to an embodiment of the present disclosure, the array substrate further includes: a plurality of sub-pixels, located in the first region of the base substrate and at a side of the connecting portion away from the gate driving structure. The plurality of gate lines include a plurality of first gate lines and a plurality of second gate lines, the plurality of first gate lines and the plurality of second gate lines are alternately arranged along the second direction, at least part sub-pixels include a light emitting element and a driving circuit for driving the light emitting element to emit light, the driving circuit includes at least two transistors, and gate electrodes of two transistors of the at least two transistors are electrically connected with the first gate line and the second gate line, respectively.

For example, according to an embodiment of the present disclosure, in terms of the first gate line and the second gate line electrically connected with a same driving circuit, the connecting portion of the first gate line and the electrostatic discharge pad of the first gate line are both located at a side of the first gate line close to the second gate line, and the connecting portion of the second gate line and the electrostatic discharge pad of the second gate line are both located at a side of the second gate line close to the first gate line.

For example, according to an embodiment of the present disclosure, the plurality of sub-pixels are arrayed along the first direction and the second direction to form a plurality of pixel rows and a plurality of pixel columns, and the first gate line and the second gate line which are electrically connected with a same driving circuit are respectively located at two sides of a pixel row where the driving circuit is located.

An embodiment of the present disclosure provides another array substrate including: a base substrate, which includes a first region and a second region, the second region being located on at least one side of the first region in a first direction; a plurality of gate lines, located in the first region of the base substrate, the plurality of gate lines being arranged along a second direction, the first direction being intersected with the second direction; a gate driving structure, located in the second region of the base substrate, and the gate driving structure being configured to be electrically connected with the plurality of gate lines. Each of at least certain gate lines of the plurality of gate lines includes a plurality of sub-gate lines arranged at intervals along an extending direction thereof, two adjacent sub-gate lines are electrically connected through a connecting unit, and the connecting unit and the gate line are located in different layers.

For example, according to an embodiment of the present disclosure, the connecting unit is located between two adjacent sub-gate lines, the connecting unit includes a first connecting unit and a second connecting unit which are stacked and are arranged between the two adjacent sub-gate lines, the first connecting unit is located between the gate line and the base substrate, the second connecting unit is located at a side of the gate line away from the base substrate, the first connecting unit is electrically connected with the second connecting unit, and the gate line is electrically connected with the second connecting unit.

An embodiment of the present disclosure provides a display device, including the array substrate provided by any embodiment as mentioned above.

BRIEF DESCRIPTION OF DRAWINGS

In order to clearly illustrate the technical solution of the embodiments of the invention, the drawings of the embodiments will be briefly described in the following; it is obvious that the described drawings are only related to some embodiments of the present disclosure and thus are not limitative of the present disclosure.

DETAILED DESCRIPTION

Figure 1:
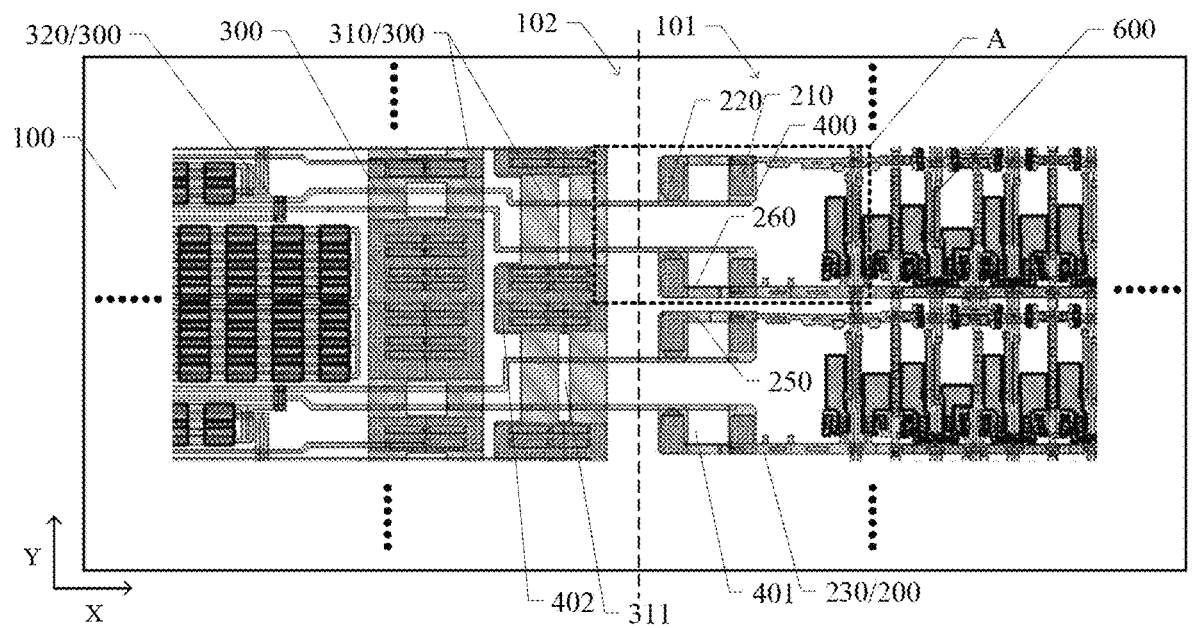
FIG. 1 is a schematic partial planar structural diagram of an array substrate provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects.

The features "parallel to," "perpendicular to," "equal to," etc., all include the features "parallel to," "perpendicular to," "equal to," etc., in the strict sense, as well as the cases containing certain errors, such as "approximately parallel to," "approximately perpendicular to," "approximately equal to," etc. Considering the measurement and the errors related to the measurement of a specific quantity (e.g., the limitation of the measurement system), they are within an acceptable deviation range for the specific quantity determined by those skilled in the art. For example, the term "approximately" can mean within one or more standard deviations, or within 10% or 5% deviation of the stated value. When the quantity of a component is not specified in the following description of the embodiments of the present disclosure, it means that the number of the component can be one or more, or can be understood as at least one. The phrase "at least one" means one or more, and the phrase "plurality of" means at least two. The "being disposed in a same layer" in the present disclosure refers to that two (or more than two) structures are structures which are formed by the same deposition process and patterned by the same patterning process, and materials thereof may be the same or different. The "integrated structure" in the present disclosure refers to that two (or more than two) structures are structures connected with each other, which are formed by the same deposition process and patterned by the same patterning process, and materials thereof may be the same or different.

The embodiments of the disclosure provide an array substrate and a display device. The array substrate includes a base substrate, and a plurality of gate lines, a gate driving structure, an interconnecting structure and an insulating layer, which are located on the base substrate. The base substrate includes a first region and a second region, and the second region is located on at least one side of the first region in a first direction; the plurality of gate lines are located in the first region, the plurality of gate lines are arranged along a second direction, and the first direction is intersected with the second direction; the gate driving structure is located in the second region, and the gate driving structure is configured to be electrically connected with the plurality of gate lines; the interconnecting structure is located at a side of the plurality of gate lines away from the base substrate, and the plurality of gate lines are electrically connected with the gate driving structure through the interconnecting structure; the insulating layer is located between the plurality of gate lines and the interconnecting structure. A part, close to the gate driving structure, of at least one gate line of the plurality of gate lines includes a first connecting portion and a second connecting portion, and the second connecting portion is located between the gate driving structure and the first connecting portion; the insulating layer includes at least one first via hole and at least one second via hole, the first connecting portion is electrically connected with the interconnecting structure through the first via hole so as to be electrically connected with the gate driving structure, and a straight line extending in a direction perpendicular to the base substrate passes through the second connecting portion, the second via hole and the interconnecting structure in turn. The gate line in the array substrate provided by the embodiments of the present disclosure is electrically connected with the interconnecting structure through the first connecting portion and the second connecting portion, which is helpful to improve the electrical connection effect between the gate line and the gate driving structure.

Hereinafter, the array substrate and the display device provided by the embodiments of the present disclosure will be described with reference to the accompanying drawings.

Figure 2:
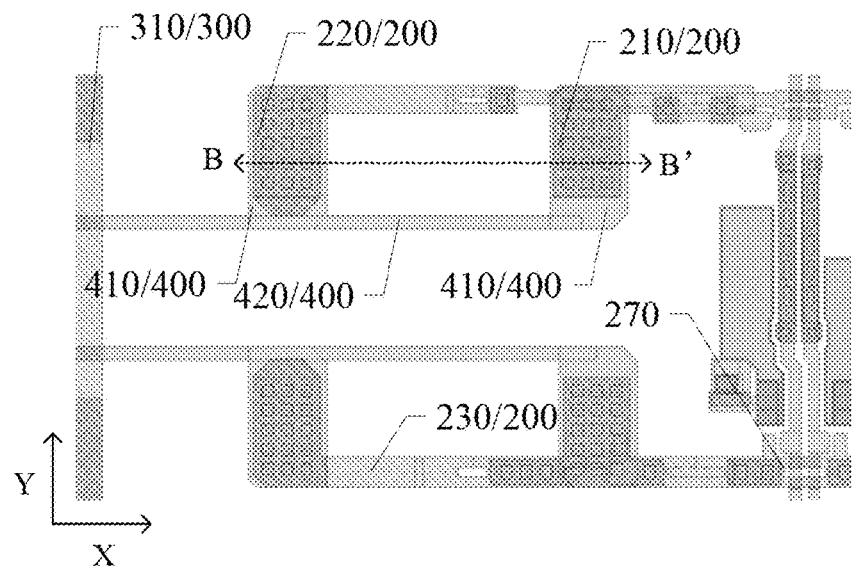
FIG. 2 is an enlarged view of the region A shown in FIG. 1.
Figure 3:
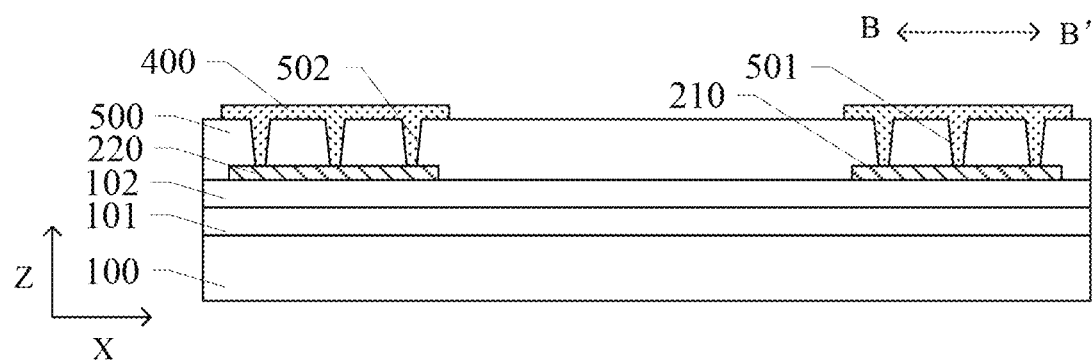
FIG. 3 is a schematic partial cross-sectional structural diagram taken along the line BB' shown in FIG. 2.

FIG. 1 is a schematic partial planar structural diagram of an array substrate provided by an embodiment of the present disclosure, FIG. 2 is an enlarged view of the region A shown in FIG. 1, and FIG. 3 is a schematic partial cross-sectional structural diagram taken along the line BB' shown in FIG. 2. As shown in FIGS. 1-3, the array substrate includes a base substrate 100, and a plurality of gate lines 200, a gate driving structure 300, an interconnecting structure 400 and an insulating layer 500, which are located on the base substrate 100. The base substrate 100 includes a first region 101 and a second region 102, and the second region 102 is located on at least one side of the first region 101 in the first direction. For example, the first region 101 includes a display region for displaying an image, and the second region 102 includes a non-display region surrounding the display region. FIG. 1 illustratively shows the position where the first region 101 meets the second region 102. For example, the dividing line between the first region 101 and the second region 102 can be located in the gap between the gate lines 200 and the gate driving structure 300. For example, the second region 102 can be located only on one side of the first region 101 or on both sides of the first region 101 in the first direction, without being limited in the embodiments of the present disclosure.

As shown in FIGS. 1-3, the plurality of gate lines 200 are located in the first region 101 of the base substrate 100, the plurality of gate lines 200 are arranged along the second direction, and the first direction is intersected with the second direction. For example, FIG. 1 illustratively shows that the first direction is the X direction and the second direction is the Y direction. For example, the first direction and the second direction can be perpendicular to each other. But not limited to this case, the first direction and the second direction can be interchanged. For example, one of the first direction and the second direction can be a row direction and the other can be a column direction. For example, the included angle between the first direction and the second direction can be 30-150 degrees, such as 60-120 degrees, such as 80-100 degrees, such as 85-95 degrees, etc.

As shown in FIGS. 1-3, the gate driving structure 300 is located in the second region 102 of the base substrate 100, and the gate driving structure 300 is configured to be electrically connected with the plurality of gate lines 200. For example, the gate driving structure 300 can include a plurality of gate driving units (Gate On Array, GOA), and each gate driving unit can be electrically connected with sub-pixels of one row to output a row scanning signal for driving the sub-pixels of this row. For example, the gate driving unit can include a voltage-dependent CLK and CLKB signal pair, an input signal (Input), a gate-off signal (Vss), a reset signal (Reset), and an output signal (Output) of the current row. For example, the gate driving unit can include a 4TIC (including four TFTs and one capacitor C) cell structure, an 8TIC (including eight TFTs and one capacitor C) cell structure and the like.

As shown in FIGS. 1-3, the interconnecting structure 400 is located at a side of the plurality of gate lines 200 away from the base substrate 100, and the plurality of gate lines 200 are electrically connected with the gate driving structure 300 through the interconnecting structure 400; the insulating layer 500 is located between the plurality of gate lines 200 and the interconnecting structure 400. For example, the insulating layer 500 can be an interlayer insulating layer.

As shown in FIGS. 1-3, the part, close to the gate driving structure 300, of at least one gate line 200 of the plurality of gate lines 200 includes a first connecting portion 210 and a second connecting portion 220, and the second connecting portion 220 is located between the gate driving structure 300 and the first connecting portion 210. For example, at least some gate lines 200 of the plurality of gate lines 200 include a first connecting portion 210 and a second connecting portion 220. For example, each gate line 200 of the plurality of gate lines 200 includes a first connecting portion 210 and a second connecting portion 220.

As shown in FIGS. 1-3, the insulating layer 500 includes at least one first via hole 501 and at least one second via hole 502, the first connecting portion 210 is electrically connected with the interconnecting structure 400 through the first via hole 501 so as to be electrically connected with the gate driving structure 300, and a straight line extending in the direction perpendicular to the base substrate 100 passes through the second connecting portion 220, the second via hole 502 and the interconnecting structure 400 in turn. The gate line in the array substrate provided by the embodiments of the present disclosure is electrically connected with the interconnecting structure through the first connecting portion and the second connecting portion, which is helpful to improve the electrical connection effect between the gate line and the gate driving structure.

In some examples, as shown in FIGS. 1-3, at least a part of the second connecting portion 220 is electrically connected with the interconnecting structure 400 through the second via hole 502 so as to be electrically connected with the gate driving structure 300.

In some examples, as shown in FIGS. 1-3, the at least one first via hole 501 includes a plurality of first via holes 501, the at least one second via hole 502 includes a plurality of second via holes 502, and the ratio of the number of the first via holes 501 to the number of the second via holes 502 is in the range of 0.9-1.1. For example, the number of the first via holes 501 is the same as the number of the second via holes 502. In the embodiment of the present disclosure, by setting the number of the first via holes to be the same as the number of the second via holes, the process manufacturing cost is reduced, and at the same time, the uniformity of the electrical connection between the interconnecting structure and either of the first connecting portion and the second connecting portion is improved.

For example, the number of the first via holes 501 can be in the range of 2-20, such as 3-18, such as 4-16, etc. By setting a plurality of first via holes and a plurality of second via holes, it is helpful to improve the electrical connection effect between the gate line and the interconnecting structure.

For example, the first connecting portion 210 is connected with the interconnecting structure 400 through all the first via holes 501 overlapping with the first connecting portion 210. For example, the second connecting portion 220 is connected with the interconnecting structure 400 through at least some second via holes 502 among all the second via holes 502 overlapping with the second connecting portion 220. For example, the second connecting portion 220 is connected with the interconnecting structure 400 through all the second via holes 502 overlapping with the second connecting portion 220. In the embodiment of the present disclosure, at least a part of the second connecting portion is electrically connected with the interconnecting structure while the first connecting portion is electrically connected with the interconnecting structure, which is helpful to improve the electrical connection effect between the gate line and the gate driving structure.

For example, as shown in FIG. 3, the array substrate further includes a buffer layer 101 and a gate insulating layer 102, which are located between the first connecting portion 220 and the base substrate 100.

For example, the first connecting portion 210 and the second connecting portion 220 can be the same in shape and area; or the first connecting portion 210 and the second connecting portion 220 are different in at least one of shape and area, but the area of the part of the first connecting portion 210 used for electrical connection with the interconnecting structure 400 and the area of the part of the second connecting portion 220 used for electrical connection with the interconnecting structure 400 are the same.

In some examples, as shown in FIGS. 1-3, the interconnecting structure 400 includes a plurality of sub-interconnecting structures 410, and two sub-interconnecting structures 410, which are respectively electrically connected with the first connecting portion 210 and the second connecting portion 220 of the same gate line 200, are electrically connected with each other. For example, along the direction perpendicular to the base substrate 100 (that is, the Z direction shown in FIG. 3), the first connecting portion 210 overlaps with the sub-interconnecting structure 410 electrically connected with the first connecting portion 210, and the second connecting portion 220 overlaps with the sub-interconnecting structure 410 electrically connected with the second connecting portion 220.

For example, as shown in FIGS. 1-2, the ratio of the area of the orthographic projection of the first connecting portion 210 on the base substrate 100 to the area of the orthographic projection of the sub-interconnecting structure 410 overlapping with the first connecting portion 210 on the base substrate 100 is in the range of 0.5-1.5, or 0.6-1.4, or 0.7-1.3, or 0.8-1.2. For example, the orthographic projection of the first connecting portion 210 on the base substrate 100 is completely within the orthographic projection of the sub-interconnecting structure 410 on the base substrate 100, and the orthographic projection of the second connecting portion 220 on the base substrate 100 is completely within the orthographic projection of the sub-interconnecting structure 410 on the base substrate 100.

For example, as shown in FIGS. 1-3, the first connecting portion 210 and the second connecting portion 220 of the same gate line 200 are arranged at intervals. For example, two sub-interconnecting structures 410 electrically connected with the first connecting portion 210 and the second connecting portion 220 of the same gate line 200 are arranged at intervals. For example, the distance between the first connecting portion 210 and the second connecting portion 220 of the same gate line 200 is not less than the distance between the two sub-interconnecting structures 410 corresponding thereto. For example, the distance between the first connecting portion 210 and the second connecting portion 220 of the same gate line 200 is greater than the distance between the two sub-interconnecting structures 410 corresponding thereto.

The above-mentioned "distance between the first connecting portion 210 and the second connecting portion 220" can refer to the distance between two edges thereof which are close to each other, but it is not limited to this case, and it can also refer to the distance between their centers in the X direction. The above-mentioned "distance between two sub-interconnecting structures 410" can refer to the distance between two edges thereof which are close to each other, but it is not limited to this case, and it can also refer to the distance between their centers in the X direction.

In some examples, as shown in FIGS. 1-3, the interconnecting structure 400 further includes a connecting line 420, and the two sub-interconnecting structures 410, which are respectively electrically connected with the first connecting portion 210 and the second connecting portion 220 of the same gate line 200, are electrically connected with each other through the connecting line 420. For example, the two sub-interconnecting structures 410 and the connecting line 420 can be an integrated structure. For example, the orthographic projection of the connecting line 420 on the base substrate 100 does not overlap with the orthographic projection of the gate line 200 on the base substrate 100. For example, the orthographic projection of the connecting line 420 on a straight line extending in the X direction overlaps with the orthographic projection of the gate line 200 on the straight line.

In some examples, as shown in FIGS. 1-3, each gate line 200 includes a gate line main body portion 230 extending in a direction intersected with the second direction. For example, the gate line main body portion 230 extends in the first direction. For example, the maximum size of the gate line main body portion 230 in the second direction is not greater than the maximum size of either the first connecting portion 210 or the second connecting portion 220 in the second direction. For example, the maximum size of the gate line main body portion 230 in the second direction is less than the maximum size of either the first connecting portion 210 or the second connecting portion 220 in the second direction. For example, the gate line main body portion 230, the first connecting portion 210 and the second connecting portion 220 are an integrated structure. For example, a part of the gate line main body portion 230 is provided between the first connecting portion 210 and the second connecting portion 220.

In some examples, as shown in FIGS. 1-3, in at least one gate line 200, both the first connecting portion 210 and the second connecting portion 220 protrude from a same side of the gate line main body portion 230 in the second direction. For example, the size of the protruding part of at least one of the first connecting portion 210 and the second connecting portion 220 relative to the gate line main body portion 230 in the second direction is not less than the maximum size of the gate line main body portion 230 in the second direction.

For example, each gate line 200 of the plurality of gate lines 200 includes a first connecting portion 210, and the plurality of first connecting portions 210 included in the plurality of gate lines 200 are arranged in the second direction. For example, the plurality of first connecting portions 210 are arranged at unequal intervals, and the interval between two adjacent first connecting portions 210 with a relatively large interval is larger than the size of the first connecting portion 210 in the second direction, and the interval between two adjacent first connecting portions 210 with a relatively small interval is smaller than the size of the first connecting portion 210 in the second direction.

In some examples, as shown in FIGS. 1-3, two sub-interconnecting structures 410, the gate line main body portion 230 and the connecting line 420 enclose a hollow region 401. For example, the shape of the hollow region 401 can be polygonal, such as quadrilateral.

The array substrate provided by the embodiments of the present disclosure can be applied to a transparent display device, and by setting a hollow region between the interconnecting structure and the gate lines, it is helpful to improve the light transmittance of the array substrate.

For example, as shown in FIGS. 1-3, the area of the hollow region 401 is greater than the area of the orthographic projection of at least one of the first connecting portion 210 and the second connecting portion 220 on the base substrate 100. For example, the ratio of the area of the hollow region 401 to the area of the orthographic projection of at least one of the first connecting portion 210 and the second connecting portion 220 on the base substrate 100 can be in the range of 1.01-5, or 1.2-1.8, or 1.1-1.6, or 1.3-1.5, or 1.4-4.5, or 2-4, or 2.5-4.5, or 3-3.5, etc.

In some examples, as shown in FIGS. 1-2, the distance between the gate line main body portion 230 and the connecting line 420 corresponding to the gate line main body portion 230 in the second direction is less than the size of the first connecting portion 210 in the second direction. The connecting line corresponding to the gate line main body portion refers to the connecting line included in the interconnecting structure electrically connected with the first connecting portion included in the gate line where the gate line main body portion is located.

For example, as shown in FIGS. 1-2, the gate line main body portion 230 and the connecting line 420 corresponding to the gate line main body portion 230 are arranged in parallel.

In some examples, as shown in FIGS. 1-3, the gate driving structure 300 further includes a first power line 310, and the first power line 310 is a component closest to the plurality of gate lines 200 among the components, arranged in the same layer as the plurality of gate lines 200, in the gate driving structure 300. For example, the first power line 310 can be a power line VGL for transmitting a low potential in the gate driving structure 300. For example, the low potential can be a constant low potential. For example, the first power line 310 extends in the second direction.

In some examples, as shown in FIGS. 1-3, the extending direction of the first power line 310 is intersected with the extending direction of at least part of the connecting line 420. For example, the extending direction of the at least part of the connecting line 420 is parallel to the first direction.

For example, as shown in FIG. 2, the shortest distance between the edges, close to each other, of the second connecting portion 220 and the first power line 310 is less than the shortest distance between the edges, close to each other, of the second connecting portion 220 and the first connecting portion 210. In an example of the embodiment of the present disclosure, the probability of static electricity accumulation in the first connecting portion can be reduced by increasing the distance between the first connecting portion and the second connecting portion as much as possible.

For example, the distance between the first connecting portion 210 and other structures, which are located on one side of the first connecting portion 210 away from the second connecting portion 220 and disposed in the same layer as the first connecting portion 210, is less than the distance between the first connecting portion 210 and the second connecting portion 220.

In some examples, as shown in FIGS. 1-3, the gate driving structure 300 includes output ends 320 electrically connected with the plurality of gate lines 200, the output ends 320 are located at a side of the first power line 310 away from the plurality of gate lines 200, and the connecting line 420 is electrically connected with the output end 320 across the first power line 310. For example, the output end 320 can refer to an output end of a transistor in the gate driving unit. For example, the gate driving structure 300 can include two first power lines 310, and the connecting line 420 can be connected with the output end of the transistor across the two first power lines 310.

For example, as shown in FIG. 1, the connecting line 420 is located at a side of the first power line 310 away from the base substrate 100, the first power line 310 is provided with a plurality of openings 311, and the opening 311 is arranged at the overlapping position of the connecting line 420 and the first power line 310, which is helpful to reduce the probability of crosstalk between the first power line and the connecting line.

For example, as shown in FIG. 1, the film layer in which the interconnecting structure 400 is located further includes a connecting block 402, the connecting block 402 overlaps with the first power line 300, and the connecting block 402 is electrically connected with the first power line 300 through a via hole in an insulating layer between the connecting block 402 and the first power line 300, which is helpful to reduce the resistance of the first power line 300. For example, the number of the connecting blocks 402 is plural, the plurality of connecting blocks 402 are arranged in the second direction, and the connecting line 420 and the opening 311 are arranged between two adjacent connecting blocks 402.

For example, as shown in FIG. 1, the area of each connecting block 402 is greater than the area of the first connecting portion 210. For example, the area of each connecting block 402 is greater than the area of the hollow region 401. For example, the orthographic projection of the connecting block 402 on a straight line extending in the Y direction overlaps with the orthographic projection of the first connecting portion 210 on the straight line extending in the Y direction.

In some examples, as shown in FIGS. 1-3, the second connecting portion 220 is located at one end of the gate line 200 close to the gate driving structure 300. For example, the second connecting portion 220 is an end portion of the gate line 200 closest to the first power line 310.

Figure 4:
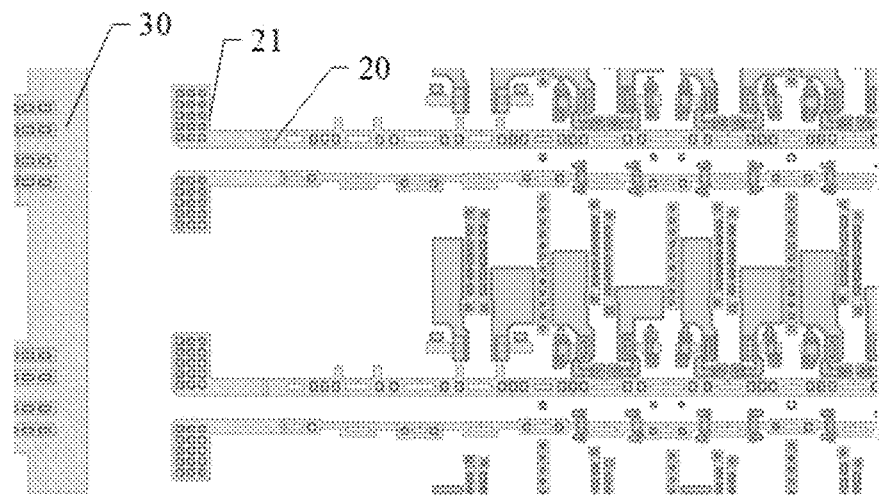
FIG. 4 is a schematic partial planar structural diagram of an array substrate.

FIG. 4 is a schematic partial planar structural diagram of an array substrate. As shown in FIG. 4, the array substrate includes a gate line 20 and a gate driving structure 30 configured to be electrically connected with the gate line 20, a connecting portion 21 is provided at one end of the gate line 20 close to the gate driving structure 30, and the connecting portion 21 is electrically connected with the gate driving structure 30 through an interconnecting structure located in another layer.

In research, the inventors of the present application have noticed that in the display field, the electrostatic problem has always been the main problem that puzzles the industry. There are many metal layers in organic light emitting diode display products, and they are more sensitive to static electricity. In a large-sized display device (such as a 55-inch or 95-inch display device), the length of the gate line is long, and for example, it can reach 2 meters or more; the length of the power line (VGL) which is arranged in the same layer as the gate line and closest to the gate line in the gate driving structure is also long, and for example, it can reach 1 meter or more; and static electricity is easy to occur at the end of the gate line close to the power line of the gate driving unit, which makes the lap joint between the gate driving unit and the gate line abnormal and the array substrate defective.

For example, as shown in FIG. 4, the connecting portion 21 is located at the end of the gate line 20 close to the power line of the gate driving structure, and static electricity is easily generated between the connecting portion 21 of the gate line 20 and the power line. For example, in the process of patterning the layer in which the gate line 20 is located to manufacture the gate line, the power line and the like, static electricity is easily generated, and the static electricity is easily concentrated at the position of the connecting portion 21. As a result, the patterned via hole of the interlayer insulating layer formed on the connecting portion 21 is blackened and fails due to electrostatic influence, which further affects the electrical connection between the connecting portion 21 and the interconnecting structure subsequently formed on the interlayer insulating layer, thus affecting the electrical connection relationship between the gate line and the gate driving unit.

Compared with the array substrate shown in FIG. 4, in the array substrate provided by the embodiments of the present disclosure, the first connecting portion 210 is added, and even if part or whole of the second connecting portion 220 cannot be electrically connected with the interconnecting structure due to static electricity generated at the position where the second connecting portion 220 is located, the first connecting portion 210 still has a good electrical connection relationship with the interconnecting structure, thus improving the stability of the electrical connection relationship between the gate line and the gate driving structure.

Figure 5:
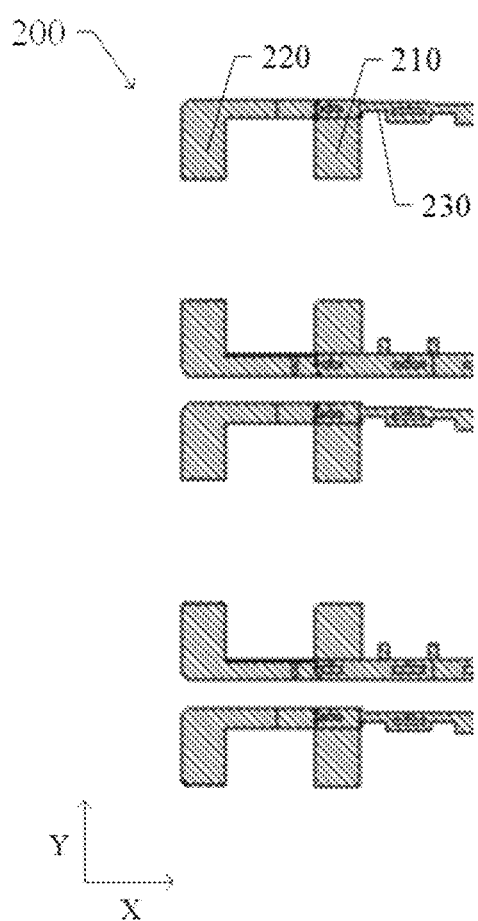
FIG. 5 is a schematic structural diagram of a part, close to a gate driving structure, of a gate line provided by an example of an embodiment of the present disclosure.

FIG. 5 is a schematic structural diagram of a part, close to a gate driving structure, of a gate line provided by an example of an embodiment of the present disclosure. For example, as shown in FIG. 5, each gate line 200 is provided with a first connecting portion 210 and a second connecting portion 220, and the first connecting portion 210 and the second connecting portion 220 are the same in shape and area. Of course, the embodiments of the present disclosure are not limited to this case, and each gate line of the plurality of gate lines can be provided with a first connecting portion and a second connecting portion, the first connecting portion and the second connecting portion in some gate lines are the same in shape and area, and the first connecting portion and the second connecting portion in some gate lines are different in shape.

Figure 6:
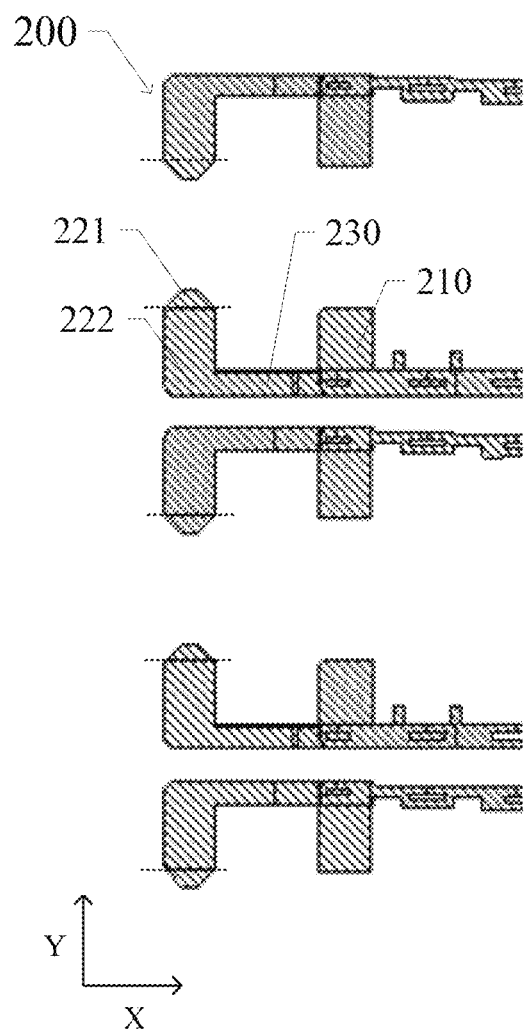
FIG. 6 is a schematic structural diagram of a part, close to a gate driving structure, of a gate line provided by an example of an embodiment of the present disclosure.

FIG. 6 is a schematic structural diagram of a part, close to a gate driving structure, of a gate line provided by an example of an embodiment of the present disclosure. The array substrate shown in FIG. 6 is different from the array substrate shown in FIG. 5 in that the shape of the second connecting portion 220 is different. For example, as shown in FIG. 6, the second connecting portion 220 of at least one gate line 200 includes a tip part 221. For example, each second connecting portion 220 includes a tip part 221. Of course, the embodiments of the present disclosure are not limited to this case. In the case where the array substrate includes a plurality of second connecting portions, some of the second connecting portions may include tip parts, and some of the second connecting portions may not include tip parts. The array substrate shown in FIG. 1 illustratively shows that the second connecting portion includes a tip part, but the array substrate shown in FIG. 1 is not limited to the case that the second connecting portion includes the tip part, that is, the second connecting portion may not include a tip part.

In the embodiments of the present disclosure, the second connecting portion is provided with a tip part, so that the static electricity generated by the gate line can be concentrated at the second connecting portion, the probability of static electricity generated at the first connecting portion can be reduced, and the electrical connection effect between the first connecting portion and the interconnecting structure can be improved.

In some examples, as shown in FIG. 6, the second connecting portion 220 further includes a main part 222 connected with the tip part 221, and the main part 222 is closer to the gate line main body portion 230 than the tip part 221 is. For example, the tip part 221 and the main part 222 are an integrated structure. For example, the shape of the tip part 221 can be polygonal, such as quadrangle, but it is not limited to this case, and it can also be triangular, pentagonal or the like.

For example, the second connecting portion 221 can include at least one tip part 221. For example, the second connecting portion 221 can include a plurality of tip parts 221, and the plurality of tip parts can include a tip part located between the main part 222 and the first power line, a tip part 221 located on one side of the main part 222 away from the gate line main body portion 230, a tip part 221 located between the main part 222 and the first connecting portion 210, and the like.

In some examples, as shown in FIG. 6, the ratio of the area of the orthographic projection of the main part 222 on the base substrate 100 to the area of the orthographic projection of the first connecting portion 210 on the base substrate 100 is in the range of 0.9-1.1. For example, the area of the orthographic projection of the main part 222 on the base substrate 100 can be equal to the area of the orthographic projection of the first connecting portion 210 on the base substrate 100. For example, the main part 222 can have the same shape and the same area as the first connecting portion 210.

For example, as shown in FIG. 6, at least part of the orthographic projection of the tip part 221 on a straight line extending in the Y direction does not overlap with the orthographic projection of the first connecting portion 210 on the straight line. For example, the orthographic projection of the tip part 221 on the straight line does not overlap with the orthographic projection of the first connecting portion 210 on the straight line.

For example, as shown in FIG. 6, at least part of the orthographic projection of the tip part 221 on a straight line extending in the X direction overlaps with the orthographic projection of the main part 222 on the straight line. For example, the orthographic projection of the tip part 221 on the straight line extending in the X direction completely falls within the orthographic projection of the main part 222 on the straight line.

In some examples, as shown in FIG. 6, in terms of the main part 222 and the tip part 221 connected with each other, the area of the orthographic projection of the tip part 221 on the base substrate 100 is smaller than the area of the main part 222 on the base substrate 100.

Figure 7:
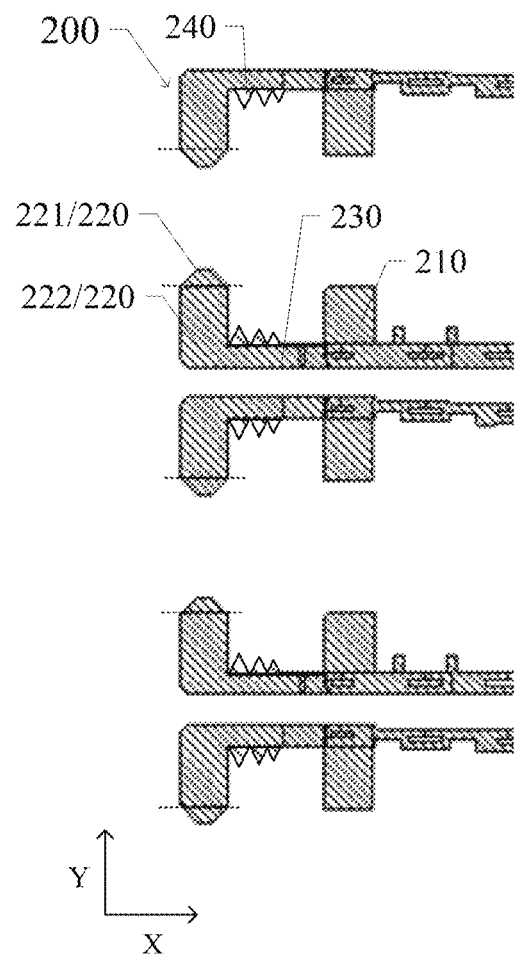
FIG. 7 is a schematic structural diagram of a part, close to a gate driving structure, of a gate line provided by an example of an embodiment of the present disclosure.

FIG. 7 is a schematic structural diagram of a part, close to a gate driving structure, of a gate line provided by an example of an embodiment of the present disclosure.

In some examples, as shown in FIG. 7, the at least one gate line 200 is provided with at least one protrusion 240, and the at least one protrusion 240 is located between the first connecting portion 210 and the second connecting portion 220. By setting at least one protrusion between the first connecting portion and the second connecting portion, it is helpful to prevent static electricity from concentrating on the first connecting portion and affecting the electrical connection between the gate line and the interconnecting structure.

In some examples, as shown in FIG. 7, the at least one protrusion 240 includes a plurality of protrusions 240, and in terms of the plurality of protrusions 240, the area of the orthographic projection of a protrusion 240 closest to the second connecting portion 220 on the base substrate is greater than the area of the orthographic projection of a protrusion 240 farthest from the second connecting portion 220 on the base substrate. The farther away from the second connecting portion, the less static electricity is concentrated on the protrusion, so the area of the protrusion farthest from the second connecting portion can be designed to be smaller.

For example, as shown in FIG. 7, the areas of the plurality of protrusions 240 gradually decrease in the direction from a position close to the second connecting portion 220 to a position away from the second connecting portion 220. By setting the plurality of protrusions, it is helpful to further prevent static electricity from concentrating on the first connecting portion.

For example, as shown in FIG. 7, the shape of the protrusion 240 can be polygonal, such as triangle, quadrilateral, pentagon, etc.

Figure 8:
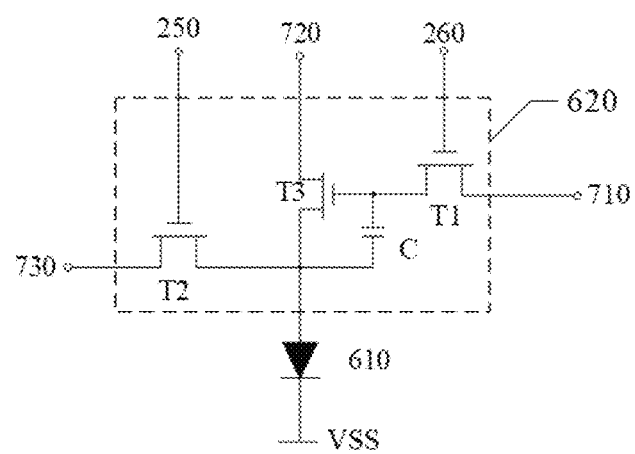
FIG. 8 is a schematic diagram of a 3T1C driving circuit applied to the array substrate.

For example, FIG. 8 is a schematic diagram of a 3T1C driving circuit applied to the array substrate. The driving circuit of the array substrate provided by the embodiments of the present disclosure is not limited to the 3T1C driving circuit, and the structure of the array substrate will be illustrated by taking the 3T1C driving circuit as an example. The driving circuit can further include a compensation circuit, a reset circuit, etc. as needed, which is not limited in the embodiments of the present disclosure.

In some examples, as shown in FIGS. 1 and 8, the array substrate further includes a plurality of sub-pixels 600, which are located in the first region 101 of the base substrate 100 and at a side of the first connecting portion 210 away from the gate driving structure 300. For example, a region in which at least part of the plurality of sub-pixels 600 are located is a display region for displaying an image. As shown in FIGS. 1 and 8, the plurality of gate lines 200 include a plurality of first gate lines 250 and a plurality of second gate lines 260, and the plurality of first gate lines 250 and the plurality of second gate lines 260 are alternately arranged along the second direction. At least some sub-pixels 600 include a light emitting element 610 and a driving circuit 620 for driving the light emitting element 610 to emit light. The driving circuit 620 includes at least two transistors, and the gate electrodes of two transistors of the at least two transistors are electrically connected with the first gate line 250 and the second gate line 260, respectively.

For example, as shown in FIG. 8, the driving circuit 620 includes a first transistor T1 and a second transistor T2, the gate electrode of the first transistor T1 is electrically connected with the second gate line 260, and the gate electrode of the second transistor T2 is electrically connected with the first gate line 250.

Figure 9A:
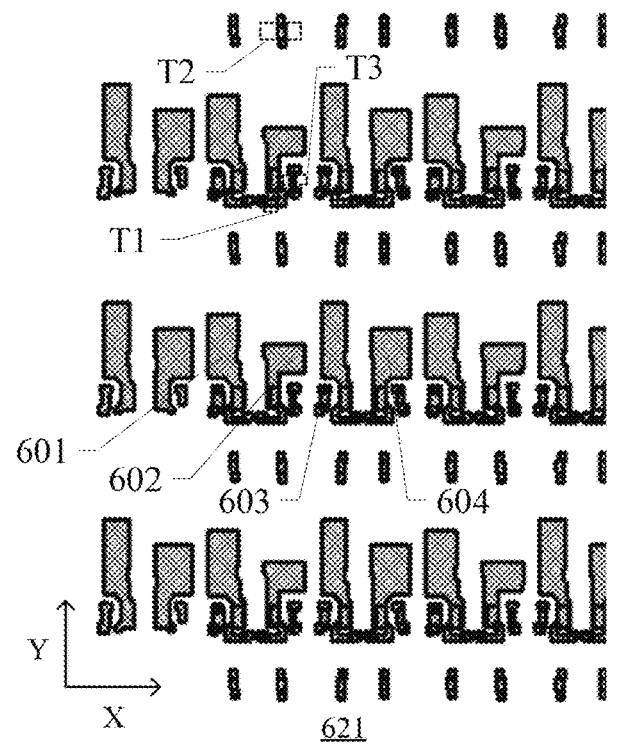
FIG. 9A is a schematic planar diagram of an active layer in an array substrate provided by at least one embodiment of the present disclosure.
Figure 9B:
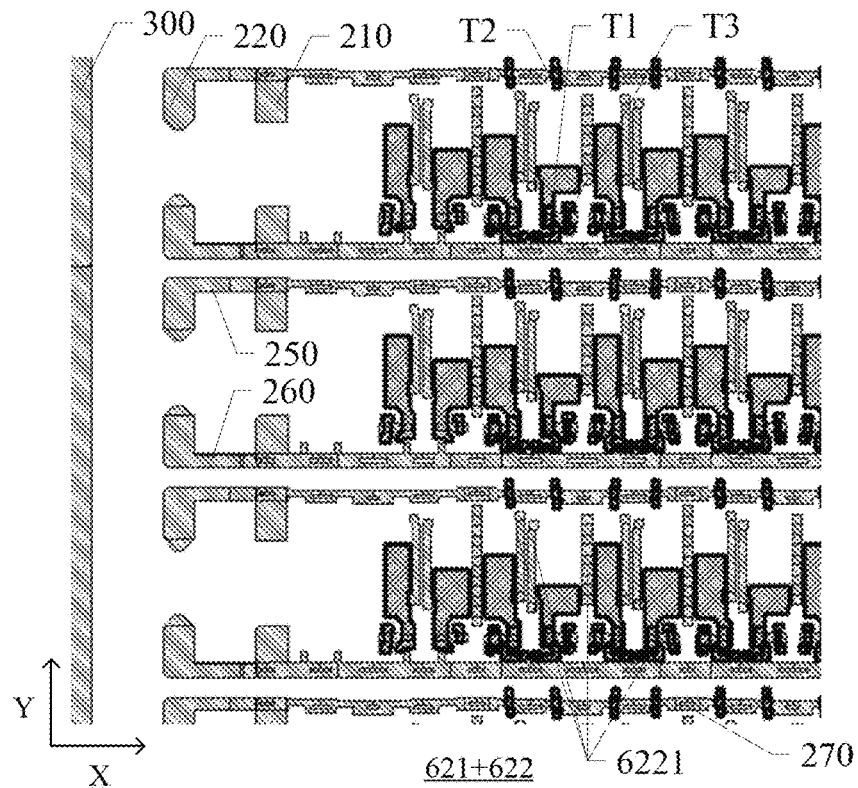
FIG. 9B is a schematic planar diagram of a stack of an active layer and a first conductive layer where a gate line is located in the array substrate provided by at least one embodiment of the present disclosure.
Figure 9C:
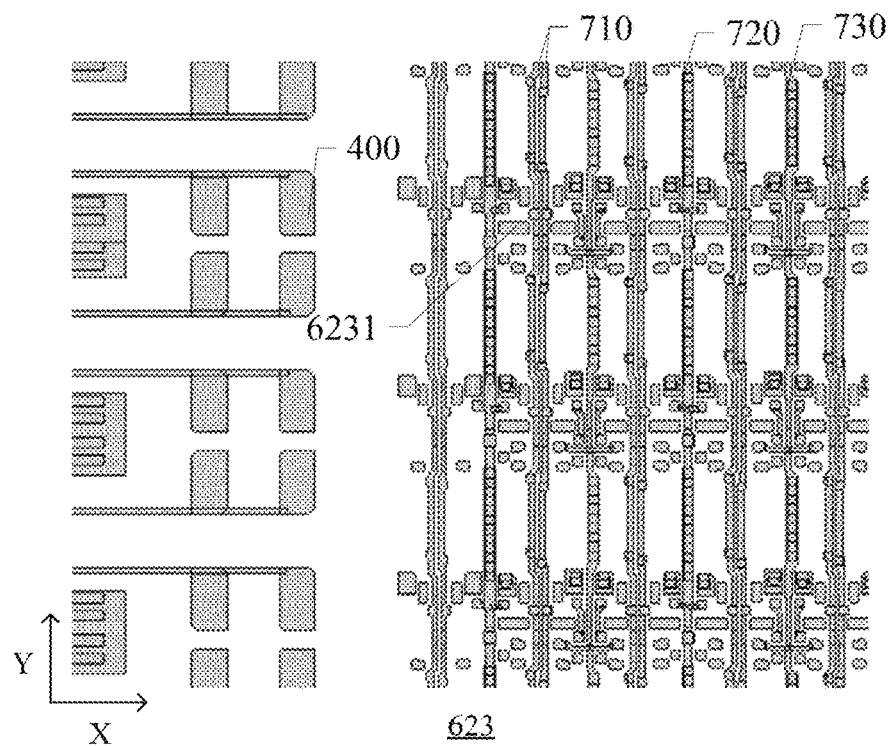
FIG. 9C is a schematic planar diagram of a second conductive layer where an interconnecting structure is located in the array substrate provided by at least one embodiment of the present disclosure.
Figure 9D:
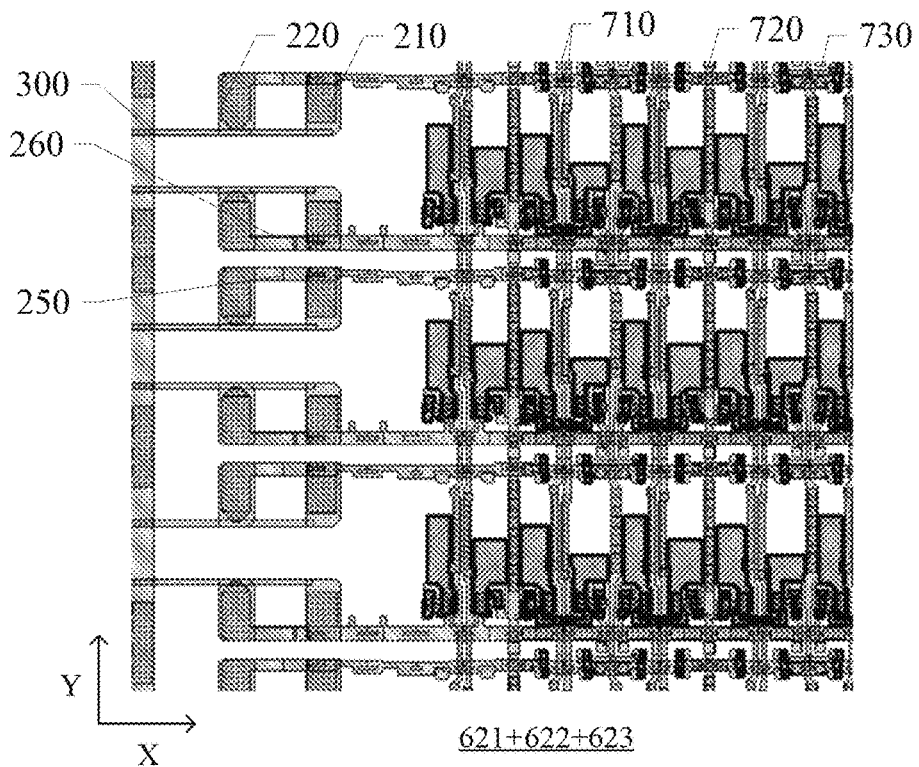
FIG. 9D is a schematic planar diagram of a stack of an active layer, a first conductive layer and a second conductive layer in an array substrate provided by at least one embodiment of the present disclosure.
Figure 9E:
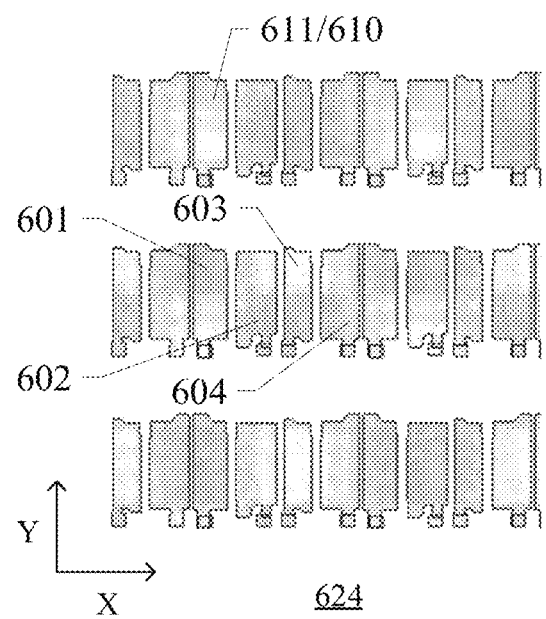
FIG. 9E is a schematic planar diagram of a first electrode of a light emitting element in the array substrate provided by at least one embodiment of the present disclosure.
Figure 9F:
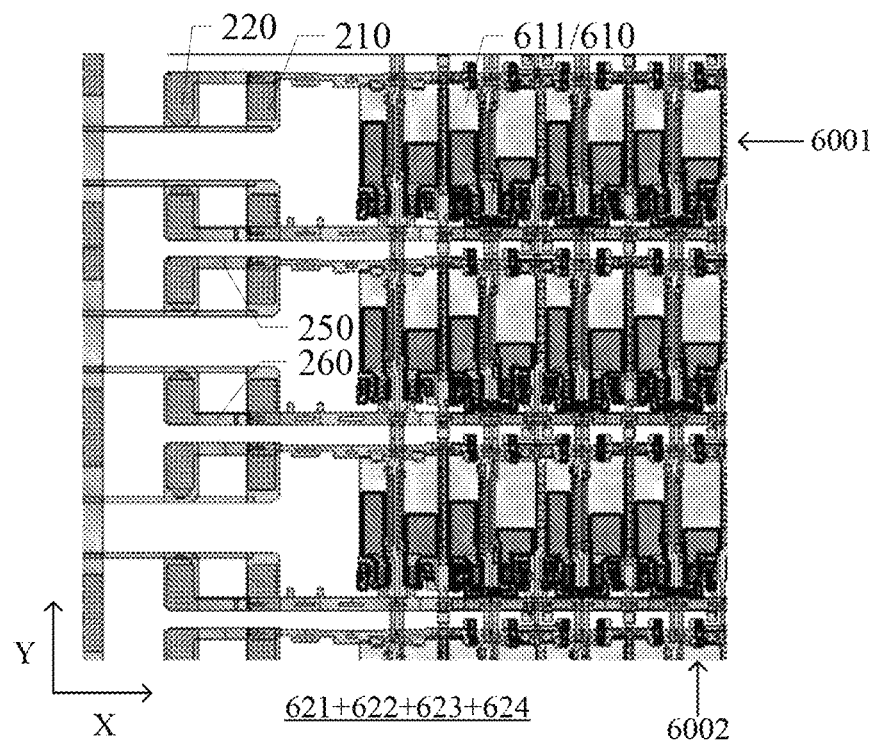
FIG. 9F is a schematic planar diagram of a stack of an active layer, a first conductive layer, a second conductive layer and a first electrode of a light emitting element in an array substrate provided by at least one embodiment of the present disclosure.

FIG. 9A is a schematic planar diagram of an active layer in an array substrate provided by at least one embodiment of the present disclosure; FIG. 9B is a schematic planar diagram of a stack of an active layer and a first conductive layer where a gate line is located in the array substrate provided by at least one embodiment of the present disclosure; FIG. 9C is a schematic planar diagram of a second conductive layer where an interconnecting structure is located in the array substrate provided by at least one embodiment of the present disclosure; FIG. 9D is a schematic planar diagram of a stack of an active layer, a first conductive layer and a second conductive layer in an array substrate provided by at least one embodiment of the present disclosure; FIG. 9E is a schematic planar diagram of a first electrode of a light emitting element in the array substrate provided by at least one embodiment of the present disclosure; and FIG. 9F is a schematic planar diagram of a stack of an active layer, a first conductive layer, a second conductive layer and a first electrode of a light emitting element in an array substrate provided by at least one embodiment of the present disclosure.

For example, as shown in FIG. 1, the thickness of the base substrate 100 can be in the range of 50 to 1000 microns. For example, the material of the base substrate 100 can be glass, such as quartz glass, etc.

In some examples, as shown in FIGS. 1 and 8-9F, the array substrate further includes a plurality of data lines 710 and a plurality of second power lines 720 located in the first region 101 on the base substrate 100. The plurality of data lines 710 are arranged along the first direction, the plurality of second power lines 720 are arranged along the first direction, and the plurality of second power lines 720 and the plurality of data lines 710 are arranged in the same layer. The driving circuit 610 of each sub-pixel 600 is electrically connected with one data line 710.

For example, as shown in FIGS. 1 and 8-9F, the driving circuit 620 further includes a driving transistor T3, the gate electrode of the driving transistor T3 is connected with the second electrode of the first transistor T1, the first electrode of the driving transistor T3 is electrically connected with the second power line 720, and the second electrode of the driving transistor T3 is electrically connected with the first electrode of the light emitting element 610 and the second electrode of the second transistor T2; the first electrode of the first transistor T1 is electrically connected with the data line 710 to receive a data signal. The first transistor T1 can also be referred to as a data writing transistor.

For example, as shown in FIGS. 8-9F, the driving circuit 620 further includes a storage capacitor C, the first capacitor electrode of the storage capacitor C is electrically connected with the gate electrode of the driving transistor T3 and the second electrode of the first transistor T1, and the second capacitor electrode of the storage capacitor C is electrically connected with the second electrode of the driving transistor T3, the first electrode 611 (e.g., the anode) of the light emitting element 610 and the second electrode of the second transistor T2.

For example, in the case where a scanning signal is applied through the second gate line 260 to turn on the first transistor T1, a data signal Vdata input from the data line 710 to the driving circuit can charge the storage capacitor C through the first transistor T1, so that the data signal Vdata can be stored in the storage capacitor C, and the stored data signal Vdata can control the conduction degree of the driving transistor T3. The first electrode of the driving transistor T3 is configured to receive a power voltage (e.g., a high power voltage VDD), and the driving transistor T3 is configured to supply an emission current $I_{OLED}$ to the light emitting element 610 when it is in a turn-on state. The second electrode (e.g., the cathode) of the light emitting element 610 is configured to receive a second voltage VSS (low voltage, e.g., ground voltage).

For example, as shown in FIGS. 1 and 8-9F, the array substrate further includes a plurality of sensing lines 730 located in the first region 101 of the base substrate 100, and the plurality of sensing lines 730 are arranged along the first direction. For example, the first electrode of the second transistor T2 is electrically connected with the sensing line 730.

For example, large-sized display products can compensate the driving circuit by combining electrical compensation and optical compensation, which can integrate the advantages of electrical compensation and optical compensation and improve the uniformity of display products. For example, electrical compensation can determine compensation data through the voltage or current of the driving circuit obtained by the sensing line, so as to compensate the characteristics (e.g., threshold voltage and mobility, etc.) of the driving thin film transistor; and optical compensation can compensate the uniformity of the display panel as a whole.

For example, the driving circuit shown in FIG. 8 is a driving circuit that can detect the threshold voltage of the driving transistor. The second transistor T2 in the driving circuit is a sensing transistor, and the first electrode of the sensing transistor T2 is connected with a detection circuit (not shown) via the sensing line 730, so as to realize the compensation function. As shown in FIG. 8, after the driving transistor T3 is turned on, the detection circuit can be charged via the second thin film transistor T2, so that the potential of the second electrode of the driving transistor T3 changes. When the voltage Vs of the second electrode of the driving transistor T3 is equal to the difference between the gate voltage Vg of the driving transistor T3 and the threshold voltage Vth of the driving transistor, the driving transistor T3 is turned off. At this time, after the driving transistor T3 is turned off, the sensing voltage (that is, the voltage Vb of the source electrode after the driving transistor T3 is turned off) can be obtained from the second electrode of the driving transistor T3 via the turned-on second transistor T2. After obtaining the voltage Vb of the source electrode of the turned-off driving transistor T3, the threshold voltage of the drive transistor T3 can be obtained as Vth=Vdata−Vb. Therefore, compensation data can be established for each driving circuit based on the threshold voltage of the driving transistor in each driving circuit, and then the threshold voltage compensation function of each sub-pixel on the array substrate can be realized.

For example, the second electrode of the second transistor T2 can also input a sensed current of the first electrode of the light emitting element 610 to the detection circuit by the sensing line, so as to obtain the current used by the light emitting element 610 to emit light, and then compensation data is established for each light emitting element based on the current, and further, the optical compensation of the light emitting element of each sub-pixel can be realized to compensate the uniformity of the display panel as a whole.

The transistors used in the embodiments of the present disclosure can all be thin film transistors, field effect transistors or other switching elements with the same characteristics, and the embodiments of the present disclosure are all illustrated by taking the thin film transistors as an example. The source electrode and the drain electrode of the transistor used herein can be symmetrical in structure, so there may be no difference in structure between the source electrode and the drain electrode. In the embodiments of the present disclosure, in order to distinguish the two electrodes of the transistor other than the gate electrode, one of them is directly described as a first electrode and the other as a second electrode. In addition, transistors can be divided into N-type transistors and P-type transistors according to their characteristics. In the case where the transistor is a P-type transistor, the turn-on voltage is a low-level voltage (e.g., 0V, −5V, −10V or other suitable voltage) and the turn-off voltage is a high-level voltage (e.g., 5V, 10V or other suitable voltage); and in the case where the transistor is an N-type transistor, the turn-on voltage is a high-level voltage (e.g., 5V, 10V or other suitable voltage) and the turn-off voltage is a low-level voltage (e.g., 0V, −5V, −10V or other suitable voltage). It should be noted that the following descriptions take the transistors in FIG. 8 being N-type transistors as an example, which should not be taken as a limitation to the present disclosure.

In some examples, as shown in FIGS. 9A-9F, the plurality of data lines 400 and at least some components of the interconnecting structure 400 are arranged in the same layer.

For example, as shown in FIGS. 1, 3 and 9A-9F, the active layer 621 is located between the first conductive layer 622 and the base substrate 100, and for example, the active layer 621 is located between the buffer layer 101 and the gate insulating layer 102. For example, a light shielding layer is also provided between the active layer 621 and the base substrate, and the light shielding layer is located between the buffer layer 101 and the base substrate 100. For example, the orthographic projection of the active layer 621 on the base substrate overlaps with the orthographic projection of the light shielding layer on the base substrate. For example, a conductive layer can be provided between the light shielding layer and the active layer 621 as a plate of the storage capacitor. For example, a partial structure of the active layer 621 can be the other plate of the storage capacitor.

For example, the material of the active layer 621 can include oxide, such as indium gallium zinc oxide (IGZO), zinc nitride oxide (ZnON), indium tin zinc oxide (ITZO) and the like amorphous oxide.

In some examples, as shown in FIGS. 1, 3 and 9A-9F, the driving circuit 620 of each of at least some sub-pixels 600 includes an active layer 621, and the plurality of sub-pixels 600 include first color sub-pixels 601 and second color sub-pixels 602, and the area of the active layer 621 of the first color sub-pixel 601 is greater than the area of the active layer 621 of the second color sub-pixel 602. For example, the first color sub-pixel 601 can be a red sub-pixel and the second color sub-pixel 602 can be a green sub-pixel. Of course, the embodiments of the present disclosure are not limited to this case. The first color sub-pixel can be a blue sub-pixel and the second color sub-pixel can be a red sub-pixel, or the first color sub-pixel can be a blue sub-pixel and the second color sub-pixel can be a green sub-pixel. The width-length ratios (W/L) of the driving transistors of different color sub-pixels are different, so the required capacitances are different and the areas of the active layers are different.

In some examples, as shown in FIGS. 1, 3 and 9A-9F, the plurality of sub-pixels 600 further includes a plurality of third color sub-pixels 603 and a plurality of fourth color sub-pixels 604. For example, the first color sub-pixel 601, the second color sub-pixel 602, the third color sub-pixel 603, and the fourth color sub-pixel 604 are a red sub-pixel, a green sub-pixel, a blue sub-pixel, and a white sub-pixel, respectively.

In some examples, as shown in FIGS. 1 and 9A-9F, the plurality of sub-pixels 600 are arrayed along the first direction and the second direction to form a plurality of pixel rows 6001 and a plurality of pixel columns 6002, one of the first direction and the second direction is a row direction, and the other of the first direction and the second direction is a column direction. For example, the first direction is the row direction and the second direction is the column direction. But not limited to this case, the row direction and the column direction can be interchanged.

In some examples, as shown in FIGS. 1 and 9A-9F, at least one pixel row 6001 includes a first color sub-pixel 601, a second color sub-pixel 602, a third color sub-pixel 603 and a fourth color sub-pixel 604 which are sequentially and circularly arranged along the row direction. For example, two columns of dummy sub-pixels are arranged between the first color sub-pixel 601 closest to the first connecting portion 210 and the first connecting portion 210, and these two columns of dummy sub-pixels are not used for display.

For example, as shown in FIGS. 1 and 9A-9F, a plurality of sub-pixels 600 located in the same pixel column 6002 can be sub-pixels of the same color. But not limited to this case, a plurality of sub-pixels located in the same pixel column can also be the first color sub-pixel, the second color sub-pixel, the third color sub-pixel and the fourth color sub-pixel which are sequentially and circularly arranged along the column direction.

For example, as shown in FIGS. 3 and 9A-9F, the second conductive layer 623 is located at a side of the first conductive layer 622 away from the base substrate. For example, an insulating layer 500 is disposed between the first conductive layer 622 and the second conductive layer 623. For example, the second conductive layer 623 includes the data line 710, the second power line 720 and the sensing line 730.

For example, as shown in FIGS. 9A-9F, a plurality of first connecting bars 6221 are provided in the first conductive layer 622. For example, some first connecting bars 6221 overlap with the data line 710 and are electrically connected with the data line 710 through via holes in the insulating layer 500 to reduce the resistance of the data line 710; some first connecting bars 6221 overlap with the second power line 720 and are electrically connected with the second power line 720 through via holes in the insulating layer 500 to reduce the resistance of the second power line 720; and some first connecting bars 6221 overlap with the sensing line 730 and are electrically connected with the sensing line 730 through via holes in the insulating layer 500 to reduce the resistance of the sensing line 730.

In some examples, as shown in FIGS. 2 and 9B, the at least one gate line 200 is provided with at least one opening 270. For example, each gate line 200 is provided with a plurality of openings 270. For example, as shown in FIGS. 9B-9F, at least some openings 270 provided in the gate line 200 overlap with at least one of the data line 710, the second power line 720 and the sensing line 730.

By setting the part of the gate line crossing the signal line disposed in the second conductive layer as an opening structure, which can also be called a ring-shaped structure or a dual-channel structure, the yield of the device can be effectively improved. For example, the position where the signal lines cross is prone to short circuit failure due to electrostatic breakdown of parasitic capacitance. In the detection process, when a short circuit failure is detected in one channel of the ring-shaped structure, this channel can be cut off (for example, by laser cutting), and the circuit structure can still work normally via the other channel.

For example, as shown in FIGS. 9A-9F, the second conductive layer 623 includes a plurality of second connecting bars 6231 arranged in an array, the second connecting bar 6231 overlaps with the gate line 200, and the second connecting bar 6231 is electrically connected with the gate line 200 through a via hole in the insulating layer between the second connecting bar 6231 and the gate line 200, so as to reduce the resistance of the gate line 200.

For example, as shown in FIGS. 9E-9F, a third conductive layer 624 where the first electrode 611 of the light emitting element 610 is located is provided at a side of the second conductive layer 623 away from the first conductive layer 621. For example, the first electrode 611 of the light emitting element 610 is electrically connected with the second electrode of the driving transistor through the second conductive layer 623.

In some examples, as shown in FIGS. 8-9F, in the first gate line 250 and the second gate line 260 which are electrically connected with the same driving circuit 620, the first connecting portion 210 of the first gate line 250 and the second connecting portion 220 of the first gate line 250 are both located at a side of the first gate line 250 close to the second gate line 260, and the first connecting portion 210 of the second gate line 260 and the second connecting portion 220 of the second gate line 260 are both located at a side of the second gate line 260 close to the first gate line 250.

In some examples, as shown in FIGS. 8-9F, the first gate line 250 and the second gate line 260, which are electrically connected with the same driving circuit 620, are respectively located at two sides of the pixel row where the driving circuit 620 is located. For example, a first gate line 250 and a second gate line 260 are disposed between two adjacent pixel rows 6001.

For example, as shown in FIG. 9F, both the first connecting portion 210 and the second connecting portion 220 of the gate line 200 protrude toward one side where the pixel row 6001 adjacent to the gate line 200 is located.

Figure 10:
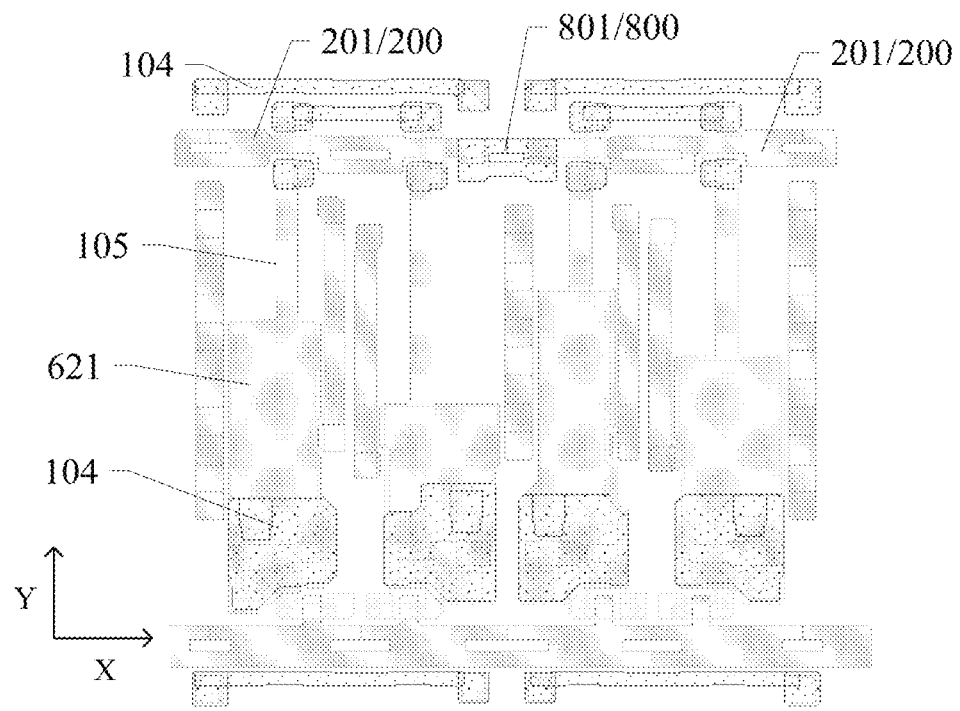
FIGS. 10-11 are schematic planar diagrams of certain layer structures provided by another example of an embodiment of the present disclosure.
Figure 11:
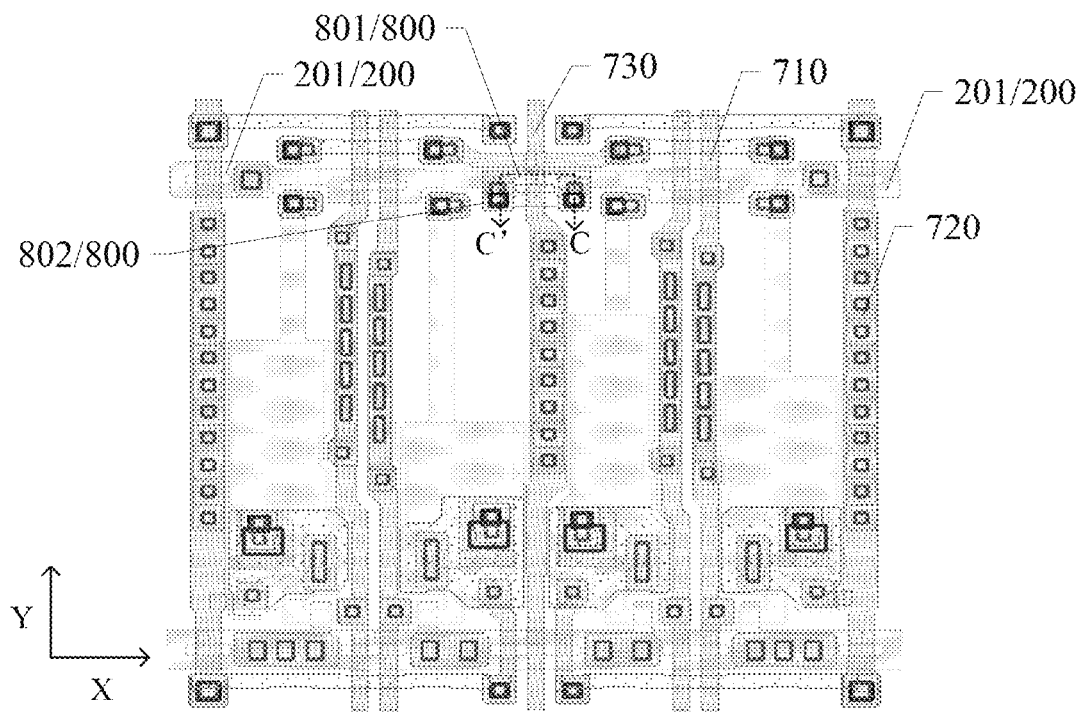
Figure 12:
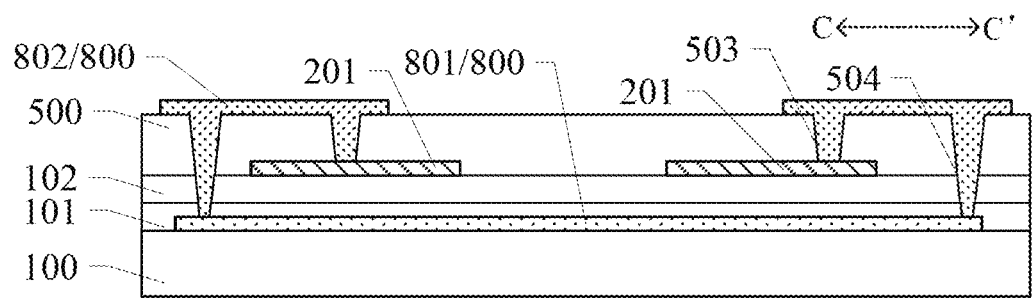
FIG. 12 is a schematic partial cross-sectional structural diagram taken along the line CC' shown in FIG. 11.

FIGS. 10-11 are schematic planar diagrams of certain layer structures provided by another example of an embodiment of the present disclosure, and FIG. 12 is a schematic partial cross-sectional structural diagram taken along the line CC' shown in FIG. 11.

The array substrate shown in FIGS. 10-11 is different from the array substrate in the example shown in FIGS. 1-9F mainly in the arrangement of gate lines 200. For example, each gate line 200 shown in FIGS. 1-9F is a continuous gate line 200, while the gate line 200 shown in FIGS. 10-11 includes a plurality of sub-gate lines 201 arranged at intervals along an extending direction thereof. Of course, the arrangement manner including a plurality of sub-gate lines 201 arranged at intervals as shown in FIGS. 10-11 can be applied to any of the examples shown in FIGS. 1-9F.

For example, a gate insulating layer, which is referred to as GI layer for short, can be deposited by means of chemical vapor deposition (CVD); and then, a gate metal layer is deposited on the gate insulating layer by sputtering equipment. The thickness of the gate metal layer is in the range of 200-1000 nanometers, and the material of the gate metal layer can be aluminum (Al), molybdenum (Mo), chromium (Cr), copper (Cu), titanium (Ti), etc. The patterns, such as the gate electrode and the gate line, etc., are defined by photolithography, wet etching and like processes; while keeping the photoresist from being removed, the photoresist on the gate metal layer will continue to be used as a mask to dry etch to obtain the GI pattern. In the process of GI dry etching, due to the long gate line, the charge accumulation is easy to cause electrostatic discharge to break down the thin film transistor, resulting in defects.

In some examples, as shown in FIGS. 10-11, each gate line 200 in at least some gate lines of the plurality of gate lines 200 includes a plurality of sub-gate lines 201 arranged at intervals along the extending direction of the gate line, and two adjacent sub-gate lines 201 are electrically connected through a connecting unit 800, and the connecting unit 800 and the gate line 200 are located in different layers. In at least one example of the embodiments of the present disclosure, a gate line with a relatively long length is divided into a plurality of sub-gate lines with a relatively short length, and two adjacent sub-gate lines are electrically connected through the connecting unit located in a different layer from the two adjacent sub-gate lines, so that the probability of concentrating a large amount of static electricity at the end portion of the gate line can be reduced. For example, the gate line manufactured in the display region is divided into a plurality of sub-gate lines in the manufacturing process, and the specific number of segments is designed as needed, and then the entire gate line is connected through the connecting units. In this way, the breakdown of the thin film transistor due to electrostatic discharge caused by the charge accumulation of the long gate line can be avoided during the dry etching of the gate insulating layer, thus ensuring the yield of display products and improving the quality of display products.

For example, as shown in FIG. 10, the plurality of sub-gate lines 201 included in one gate line 200 are arranged in the X direction.

In some examples, as shown in FIGS. 10-12, the connecting unit 800 is located between two adjacent sub-gate lines 201. The connecting unit 800 includes a first connecting unit 801 and a second connecting unit 802 which are stacked and are arranged between the two sub-gate lines 201. The first connecting unit 801 is located between the gate line 200 and the base substrate 100, the second connecting unit 802 is located at a side of the gate line 200 away from the base substrate 100, the first connecting unit 801 is electrically connected with the second connecting unit 802, and the gate line 200 is electrically connected with the second connecting unit, thus realizing the electrical connection of the two adjacent sub-gate lines.

For example, as shown in FIGS. 10-12, the array substrate further includes a light shielding layer 104 located between the active layer and the base substrate 100. For example, the light shielding layer 104 includes the first connecting unit 801.

For example, a metal layer can be deposited on the base substrate 100 by sputtering equipment, and the metal layer can be patterned by photolithography, wet etching and like processes, to form the patterns of the transparent capacitor layer 105 and the light shielding layer 105.

For example, as shown in FIGS. 3 and 12, the thickness of the buffer layer 101 can be in the range of 150-500 nanometers. For example, the material of the buffer layer 101 can include one or more of silicon oxide, silicon nitride or silicon oxynitride.

In some examples, as shown in FIGS. 10-12, the plurality of data lines 710 are arranged in the same layer as the second connecting unit 802. For example, the interconnecting structure is arranged in the same layer as the second connecting unit 802.

For example, as shown in FIGS. 10-12, the second connecting unit 802 is electrically connected with the sub-gate line 201 through a via hole 503 located in the insulating layer 500. For example, the first connecting unit 801 is electrically connected with the second connecting unit 802 through a via hole 504 located in the insulating layers between the first connecting unit 801 and the second connecting unit 802.

For example, the insulating layer 500 can be a single layer including silicon nitride or silicon oxide, or a multi-layered film layer.

For example, as shown in FIGS. 10-12, two second connecting units 802 respectively electrically connected with two adjacent sub-gate lines 201 are arranged between the two adjacent sub-gate lines 201, one first connecting unit 801 is arranged between the two adjacent sub-gate lines 201, and the two second connecting units 802 are respectively electrically connected with the one first connecting unit 801 to realize the electrical connection of the two adjacent sub-gate lines 201. Of course, the embodiments of the present disclosure are not limited to this case, and two adjacent sub-gate lines can also be directly electrically connected through the first connecting portion therebetween.

For example, the material of the film layer where the data lines are located can include aluminum (Al), molybdenum (Mo), chromium (Cr), copper (Cu), titanium (Ti), etc., and the thickness of the film layer can be in the range of 200-1000 nm.

For example, a passivation layer and a planarization layer can be further arranged at a side of the data lines away from the base substrate, and the first electrode of the light emitting element is electrically connected with the driving circuit through a via hole in the passivation layer and the planarization layer.

For example, the material of the first electrode of the light emitting element can include aluminum, molybdenum, copper, indium tin oxide, etc. For example, the thickness of the first electrode of the light emitting element can be in the range of 100-600 nanometers.

For example, a pixel defining pattern is provided at a side of the first electrode of the light emitting element away from the base substrate. For example, the pixel defining pattern includes an opening for defining a light emitting region of a light emitting element and a defining portion surrounding the opening. For example, the thickness of the defining portion can be in the range of 1.8-2 microns.

The gate line in the array substrate shown in FIGS. 10-12 can be provided with only one of the first connecting portion and the second connecting portion to realize the electrical connection to the gate driving structure.

Another embodiment of the present disclosure provides an array substrate, and the array substrate includes a base substrate, and a plurality of gate lines, a gate driving structure, an interconnecting structure and an insulating layer, which are located on the base substrate. The base substrate includes a first region and a second region, and the second region is located on at least one side of the first region in a first direction; the plurality of gate lines are located in the first region, the plurality of gate lines are arranged along a second direction, and the first direction is intersected with the second direction; the gate driving structure is located in the second region, and the gate driving structure is configured to be electrically connected with the plurality of gate lines; the interconnecting structure is located at a side of the plurality of gate lines away from the base substrate, and the plurality of gate lines are electrically connected with the gate driving structure through the interconnecting structure; the insulating layer is located between the plurality of gate lines and the interconnecting structure. A part, close to the gate driving structure, of at least one gate line of the plurality of gate lines includes a connecting portion and an electrostatic discharge pad, the electrostatic discharge pad is located between the gate driving structure and the first connecting portion, and the electrostatic discharge pad includes a tip part; the insulating layer includes at least one first via hole, and the connecting portion is electrically connected with the interconnecting structure through the first via hole so as to be electrically connected with the gate driving structure. In the embodiment of the present disclosure, by setting the electrostatic discharge pad in the gate line, the electrostatic generated by the gate line can be concentrated on the electrostatic discharge pad, so that the probability of electrostatic generation at the first connecting portion can be reduced, and the electrical connection between the first connecting portion and the interconnecting structure can be ensured.

As shown in FIGS. 1-3 and 6, the array substrate includes a base substrate 100, and a plurality of gate lines 200, a gate driving structure 300, an interconnecting structure 400 and an insulating layer 500, which are located on the base substrate 100. The base substrate 100 includes a first region 101 and a second region 102, and the second region 102 is located on at least one side of the first region 101 in a first direction; the plurality of gate lines 200 are located in the first region 101, the plurality of gate lines 200 are arranged along a second direction, and the first direction is intersected with the second direction; the gate driving structure 300 is located in the second region 102, and the gate driving structure 300 is configured to be electrically connected with the plurality of gate lines 200; the interconnecting structure 300 is located at a side of the plurality of gate lines 200 away from the base substrate 100, and the plurality of gate lines 200 are electrically connected with the gate driving structure 300 through the interconnecting structure 300; the insulating layer 500 is located between the plurality of gate lines 200 and the interconnecting structure 300. A part, close to the gate driving structure 300, of at least one gate line 200 of the plurality of gate lines 200 includes a connecting portion 210 and an electrostatic discharge pad 220, the electrostatic discharge pad 220 is located between the gate driving structure 300 and the connecting portion 210, and, the electrostatic discharge pad 220 includes a tip part 221; the insulating layer 500 includes at least one first via hole 501, and the connecting portion 210 is electrically connected with the interconnecting structure 400 through the first via hole 501 so as to be electrically connected with the gate driving structure 300.

Compared with the array substrate shown in FIG. 4, the gate line of the array substrate provided by the embodiment of the present disclosure is provided with the connecting portion and the electrostatic discharge pad at the same time, and the electrostatic generated at the end portion of the gate line can be concentrated to the electrostatic discharge pad as much as possible, so that the connecting portion can have a good electrical connection relationship with the interconnecting structure, thereby improving the stability of the electrical connection relationship between the gate line and the gate driving structure.

In some examples, as shown in FIG. 3, the insulating layer 500 further includes at least one second via hole 502, and a straight line extending in a direction perpendicular to the base substrate 100 passes through the electrostatic discharge pad 220, the second via hole 502 and the interconnecting structure 400 in turn.

In some examples, as shown in FIGS. 1-3 and 6, the electrostatic discharge pad 220 is located at one end of the gate line 200 close to the gate driving structure 300.

In some examples, as shown in FIGS. 1-3 and 6, the electrostatic discharge pad 220 further includes a main part 222 connected with the tip part 221, and the ratio of the area of the orthographic projection of the main part 222 on the base substrate 100 to the area of the orthographic projection of the connecting portion 210 on the base substrate 100 is in the range of 0.9-1.1.

The related features of the tip part and the main part of the electrostatic discharge pad in the present embodiment can be the same as those of the tip part and the main part of the second connecting portion in the above-mentioned embodiments, and details are not repeated here.

In some examples, as shown in FIG. 7, at least one gate line 200 is provided with at least one protrusion 240, and the at least one protrusion 240 is located between the connecting portion 210 and the electrostatic discharge pad 220. The protrusion in the present embodiment can have the same features as the protrusion in the above-mentioned embodiments, and details are not repeated here.

In some examples, as shown in FIGS. 1 and 8, the array substrate further includes a plurality of sub-pixels 600, which are located in the first region 101 of the base substrate 100 and at a side of the connecting portion 210 away from the gate driving structure 300. The plurality of gate lines 200 include a plurality of first gate lines 250 and a plurality of second gate lines 260, which are alternately arranged along the second direction, and at least some sub-pixels 600 include a light emitting element 610 and a driving circuit 620 for driving the light emitting element 610 to emit light, the driving circuit 620 includes at least two transistors, and gate electrodes of two transistors of the at least two transistors are connected with the first gate line 250 and the second gate line 260, respectively. Features, such as sub-pixels and their connection relationship with the gate lines, etc., in the present embodiment are the same as the corresponding features in the above-mentioned embodiments, and details are not repeated here.

In some examples, as shown in FIG. 1, in terms of the first gate line 250 and the second gate line 260 electrically connected with the same driving circuit, the connecting portion 210 of the first gate line 250 and the electrostatic discharge pad 220 of the first gate line 250 are both located at a side of the first gate line 250 close to the second gate line 260, and the connecting portion 210 of the second gate line 260 and the electrostatic discharge pad 220 of the second gate line 260 are both located at a side of the second gate line 260 close to the first gate line 250. In the present embodiment, the positional relationships of the first gate line, the second gate line, and the connecting portions and the electrostatic discharge pads arranged therein are the same as the positional relationships of the first gate line, the second gate line, and the first connecting portions and the second connecting portions arranged therein in the above-mentioned embodiments, and details are not repeated here.

In some examples, as shown in FIG. 9F, the plurality of sub-pixels 600 are arrayed along the first direction and the second direction to form a plurality of pixel rows 6001 and a plurality of pixel columns 6002, and the first gate line 250 and the second gate line 260 which are electrically connected with a same driving circuit are respectively located at two sides of the pixel row 6001 where the driving circuit is located. In the present embodiment, the positional relationships of the first gate line, the second gate line and the pixel row are the same as the corresponding positional relationships in the above embodiment, and details are not repeated here.

Another embodiment of the present disclosure provides an array substrate, and the array substrate includes a base substrate, and a plurality of gate lines and a gate driving structure, which are located on the base substrate. The base substrate includes a first region and a second region, and the second region is located on at least one side of the first region in a first direction; the plurality of gate lines are located in the first region, the plurality of gate lines are arranged along a second direction, and the first direction is intersected with the second direction; the gate driving structure is located in the second region, and the gate driving structure is configured to be electrically connected with the plurality of gate lines. Each of at least some gate lines of the plurality of gate lines includes a plurality of sub-gate lines arranged at intervals along the extending direction thereof, two adjacent sub-gate lines are electrically connected through a connecting unit, and the connecting unit and the gate line are located in different layers. In the array substrate provided by the embodiment of the present disclosure, a gate line with a relatively long length is divided into a plurality of sub-gate lines with a relatively short length, and two adjacent sub-gate lines are electrically connected through the connecting unit located in a different layer from the two adjacent sub-gate lines, so that the generation probability of a large amount of static electricity concentrated at the end portion of the gate line can be reduced, thereby ensuring the yield of display products and improving the quality of display products.

As shown in FIGS. 1 and 10-12, the array substrate includes a base substrate 100, and a plurality of gate lines 200 and a gate driving structure 300, which are located on the base substrate 100. The base substrate 100 includes a first region 101 and a second region 102, and the second region 102 is located on at least one side of the first region 101 in a first direction; the plurality of gate lines 200 are located in the first region 101, the plurality of gate lines 200 are arranged along a second direction, and the first direction is intersected with the second direction; the gate driving structure 300 is located in the second region 102, and the gate driving structure 300 is configured to be electrically connected with the plurality of gate lines 200. Each gate line 200 of at least some gate lines 200 of the plurality of gate lines 200 includes a plurality of sub-gate lines 201 arranged at intervals along the extending direction thereof, two adjacent sub-gate lines 201 are electrically connected through a connecting unit 800, and the connecting unit 800 and the gate line 200 are located in different layers.

In the embodiment of the present disclosure, a gate line with a relatively long length is divided into a plurality of sub-gate lines with a relatively short length, and two adjacent sub-gate lines are electrically connected through the connecting unit located in a different layer from the two adjacent sub-gate lines, so that the generation probability of a large amount of static electricity concentrated at the end portion of the gate line can be reduced. For example, the gate line manufactured in the display region is divided into a plurality of sub-gate lines in the manufacturing process, and the specific number of segments is designed as needed, and then the entire gate line is connected through the connecting units. In this way, the breakdown of the thin film transistor due to electrostatic discharge caused by the charge accumulation of the long gate line can be avoided during the dry etching of the gate insulating layer, thus ensuring the yield of display products and improving the quality of display products.

In some examples, as shown in FIG. 10 to FIG. 12, the connecting unit 800 is located between two adjacent sub-gate lines 201, the connecting unit 800 includes a first connecting unit 801 and a second connecting unit 802 which are stacked and are arranged between the two adjacent sub-gate lines 201, the first connecting unit 801 is located between the gate line 200 and the base substrate 100, the second connecting unit 802 is located at a side of the gate line 200 away from the base substrate 100, the first connecting unit 801 is electrically connected with the second connecting unit 802, and the gate line 200 is electrically connected with the second connecting unit 802.

The sub-gate line and the connecting unit in the present embodiment can have the same features as the sub-gate line and the connecting unit in the examples as shown in FIGS. 10-12, and details are not repeated here.

For example, the gate line including a plurality of sub-gate lines provided in the present embodiment can be applied to the array substrate shown in FIG. 4 to reduce the probability of static electricity concentration in the connecting portion 21, and can also be applied to the embodiment shown in FIG. 5 or FIG. 6 to further reduce the probability of static electricity concentration in the first connecting portion, which is helpful to improve the electrical connection effect between the gate line and the gate driving unit.

Another embodiment of the present disclosure provides a display device, which includes the array substrate provided by any of the above embodiments.

In the display device provided by the embodiment of the present disclosure, the first connecting portion is added, and even if part or whole of the second connecting portion cannot be electrically connected with the interconnecting structure due to static electricity generated at the position where the second connecting portion is located, the first connecting portion still has a good electrical connection relationship with the interconnecting structure, thus improving the stability of the electrical connection relationship between the gate line and the gate driving structure.

The gate line of the display device provided by the embodiment of the present disclosure is provided with the connecting portion and the electrostatic discharge pad at the same time, and the electrostatic generated at the end portion of the gate line can be concentrated to the electrostatic discharge pad as much as possible, so that the connecting portion can have a good electrical connection relationship with the interconnecting structure, thereby improving the stability of the electrical connection relationship between the gate line and the gate driving structure.

In the display device provided by the embodiment of the present disclosure, a gate line with a relatively long length is divided into a plurality of sub-gate lines with a relatively short length, and two adjacent sub-gate lines are electrically connected through the connecting unit located in a different layer from the two adjacent sub-gate lines, so that the generation probability of a large amount of static electricity concentrated at the end portion of the gate line can be reduced, thereby ensuring the yield of display products and improving the quality of display products.

For example, the display device provided by the embodiment of the present disclosure can be an organic light emitting diode display device.

For example, the display device can further include a cover plate located on the display side of the array substrate.

For example, the display device can be any product or component having display function, such as a mobile phone with an under-screen camera, a tablet computer, a notebook computer, a navigator, etc., without being limited in the present embodiment.

For example, the display device can be a large-sized transparent display device.

The following statements should be noted:

(1) In the accompanying drawings of the embodiments of the present disclosure, the drawings involve only the structure(s) in connection with the embodiment(s) of the present disclosure, and other structure(s) can be referred to common design(s).

(2) In case of no conflict, features in one embodiment or in different embodiments can be combined.

What have been described above are only specific implementations of the present disclosure, the protection scope of the present disclosure is not limited thereto, and the protection scope of the present disclosure should be based on the protection scope of the claims.

The invention claimed is:

1. An array substrate, comprising:
a base substrate, comprising a first region and a second region, the second region being located on at least one side of the first region in a first direction;
a plurality of gate lines, located in the first region of the base substrate, the plurality of gate lines being arranged along a second direction, the first direction being intersected with the second direction;
a gate driving structure, located in the second region of the base substrate, and the gate driving structure being configured to be electrically connected with the plurality of gate lines;
an interconnecting structure, located at a side of the plurality of gate lines away from the base substrate, the plurality of gate lines being electrically connected with the gate driving structure through the interconnecting structure;
an insulating layer, located between the plurality of gate lines and the interconnecting structure,
wherein a part, close to the gate driving structure, of at least one gate line of the plurality of gate lines comprises a first connecting portion and a second connecting portion, and the second connecting portion is located between the gate driving structure and the first connecting portion,
the insulating layer comprises at least one first via hole and at least one second via hole, the first connecting portion is electrically connected with the interconnecting structure through the first via hole so as to be electrically connected with the gate driving structure, and a straight line extending in a direction perpendicular to the base substrate passes through the second connecting portion, the second via hole and the interconnecting structure in turn;
at least a part of the second connecting portion is electrically connected with the interconnecting structure through the second via hole so as to be electrically connected with the gate driving structure;
the interconnecting structure comprises a plurality of sub-interconnecting structures, and two sub-interconnecting structures, which are respectively electrically connected with the first connecting portion and the second connecting portion of a same gate line, are electrically connected with each other.

2. The array substrate according to claim 1, wherein each gate line comprises a gate line main body portion extending in a direction intersected with the second direction, and in the at least one gate line, both the first connecting portion and the second connecting portion protrude toward a same side of the gate line main body portion in the second direction.

3. The array substrate according to claim 2, wherein the interconnecting structure further comprises a connecting line, and the two sub-interconnecting structures, which are respectively electrically connected with the first connecting portion and the second connecting portion of the same gate line, are electrically connected with each other through the connecting line, and the two sub-interconnecting structures, the gate line main body portion and the connecting line enclose a hollow region.

4. The array substrate according to claim 2, wherein the second connecting portion comprises a tip part.

5. The array substrate according to claim 4, wherein the second connecting portion is located at one end of the gate line close to the gate driving structure.

6. The array substrate according to claim 4, wherein the second connecting portion further comprises a main part connected with the tip part, the main part is closer to the gate line main body portion than the tip part is, and a ratio of an area of an orthographic projection of the main part on the base substrate to an area of an orthographic projection of the first connecting portion on the base substrate is in a range of 0.9-1.1.

7. The array substrate according to claim 4, wherein the at least one gate line is provided with at least one protrusion, and the at least one protrusion is located between the first connecting portion and the second connecting portion.

8. The array substrate according to claim 7, wherein the at least one protrusion comprises a plurality of protrusions, and in terms of the plurality of protrusions, an area of an orthographic projection of a protrusion closest to the second connecting portion on the base substrate is greater than an area of an orthographic projection of a protrusion farthest from the second connecting portion on the base substrate.

9. The array substrate according to claim 1, wherein the gate driving structure further comprises a first power line, and the first power line is a component closest to the plurality of gate lines among components, arranged in the same layer as the plurality of gate lines, in the gate driving structure;
the interconnecting structure further comprises a connecting line electrically connected with the sub-interconnecting structure, an extending direction of the first power line is intersected with an extending direction of at least part of the connecting line, the gate driving structure comprises output ends electrically connected with the plurality of gate lines, the output ends are located at a side of the first power line away from the plurality of gate lines, and the connecting line is electrically connected with the output end across the first power line.

10. The array substrate according to claim 1, further comprising:
a plurality of sub-pixels, located in the first region on the base substrate and at a side of the first connecting portion away from the gate driving structure;
wherein the plurality of gate lines comprise a plurality of first gate lines and a plurality of second gate lines, the plurality of first gate lines and the plurality of second gate lines are alternately arranged along the second direction, and at least part sub-pixels comprise a light emitting element and a driving circuit for driving the light emitting element to emit light, the driving circuit comprises at least two transistors, and gate electrodes of two transistors of the at least two transistors are electrically connected with the first gate line and the second gate line, respectively;
in terms of the first gate line and the second gate line electrically connected with a same driving circuit, the first connecting portion of the first gate line and the second connecting portion of the first gate line are both located at one side of the first gate line close to the second gate line, and the first connecting portion of the second gate line and the second connecting portion of the second gate line are both located at one side of the second gate line close to the first gate line.

11. The array substrate according to claim 10, further comprising:

a plurality of data lines, located in the first region of the base substrate and arranged along the first direction;
a plurality of second power lines, located in the first region of the base substrate and arranged along the first direction, and at least part of the plurality of second power lines are arranged in the same layer as the plurality of data lines,
wherein the plurality of data lines and at least certain components of the interconnecting structure are arranged in a same layer, and the driving circuit of each sub-pixel is electrically connected with one data line.

12. The array substrate according to claim 10, wherein the driving circuit of each of at least certain sub-pixels comprises an active layer, the plurality of sub-pixels comprise a plurality of first color sub-pixels and a plurality of second color sub-pixels, and an area of the active layer of one first color sub-pixel is greater than an area of the active layer of one second color sub-pixel;
the plurality of sub-pixels are arrayed along the first direction and the second direction to form a plurality of pixel rows and a plurality of pixel columns, one of the first direction and the second direction is a row direction, and the other of the first direction and the second direction is a column direction,
the plurality of sub-pixels further comprise a plurality of third color sub-pixels and a plurality of fourth color sub-pixels, and at least one pixel row comprises the first color sub-pixel, the second color sub-pixel, the third color sub-pixel and the fourth color sub-pixel which are sequentially and circularly arranged along the row direction.

13. The array substrate according to claim 1, wherein each of at least certain gate lines of the plurality of gate lines comprises a plurality of sub-gate lines arranged at intervals along an extending direction thereof, and two adjacent sub-gate lines are electrically connected through a connecting unit, and the connecting unit and the gate line are located in different layers.

14. A display device, comprising the array substrate according to claim 1.

15. An array substrate, comprising:
a base substrate, comprising a first region and a second region, the second region being located on at least one side of the first region in a first direction;
a plurality of gate lines, located in the first region of the base substrate, the plurality of gate lines being arranged along a second direction, the first direction being intersected with the second direction;
a gate driving structure, located in the second region of the base substrate, and the gate driving structure being configured to be electrically connected with the plurality of gate lines;
an interconnecting structure, located at a side of the plurality of gate lines away from the base substrate, the plurality of gate lines being electrically connected with the gate driving structure through the interconnecting structure;
an insulating layer, located between the plurality of gate lines and the interconnecting structure,
wherein a part, close to the gate driving structure, of at least one gate line of the plurality of gate lines comprises a connecting portion and an electrostatic discharge pad, the electrostatic discharge pad is located between the gate driving structure and the connecting portion, and the electrostatic discharge pad comprises a tip part;

the insulating layer comprises at least one first via hole, and the connecting portion is electrically connected with the interconnecting structure through the first via hole so as to be electrically connected with the gate driving structure;

the insulating layer further comprises at least one second via hole, and a straight line extending in a direction perpendicular to the base substrate passes through the electrostatic discharge pad, the second via hole and the interconnecting structure in turn.

16. The array substrate according to claim 15, wherein the electrostatic discharge pad is located at one end of the gate line close to the gate driving structure, and/or, the at least one gate line is provided with at least one protrusion, and the at least one protrusion is located between the connecting portion and the electrostatic discharge pad.

17. An array substrate comprising:

a base substrate, comprising a first region and a second region, the second region being located on at least one side of the first region in a first direction;

a plurality of gate lines, located in the first region of the base substrate, the plurality of gate lines being arranged along a second direction, the first direction being intersected with the second direction;

a gate driving structure, located in the second region of the base substrate, and the gate driving structure being configured to be electrically connected with the plurality of gate lines;

wherein each of at least certain gate lines of the plurality of gate lines comprises a plurality of sub-gate lines arranged at intervals along an extending direction thereof, two adjacent sub-gate lines are electrically connected through a connecting unit, and the connecting unit and the gate line are located in different layers;

the connecting unit is located between two adjacent sub-gate lines, the connecting unit comprises a first connecting unit and a second connecting unit which are stacked and are arranged between the two adjacent sub-gate lines, the first connecting unit is located between the gate line and the base substrate, the second connecting unit is located at a side of the gate line away from the base substrate, the first connecting unit is electrically connected with the second connecting unit, and the gate line is electrically connected with the second connecting unit.

* * * * *